(12) United States Patent
Liaw

(10) Patent No.: US 12,396,210 B2
(45) Date of Patent: Aug. 19, 2025

(54) SEMICONDUCTOR DEVICES AND METHODS FOR FABRICATION THEREOF

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 666 days.

(21) Appl. No.: 17/669,794

(22) Filed: Feb. 11, 2022

(65) Prior Publication Data
US 2023/0035086 A1     Feb. 2, 2023

Related U.S. Application Data

(60) Provisional application No. 63/226,841, filed on Jul. 29, 2021.

(51) Int. Cl.
| | |
|---|---|
| *H10D 30/67* | (2025.01) |
| *H01L 21/02* | (2006.01) |
| *H10D 30/01* | (2025.01) |
| *H10D 62/10* | (2025.01) |
| *H10D 64/01* | (2025.01) |

(52) U.S. Cl.
CPC ..... *H10D 30/6713* (2025.01); *H01L 21/0259* (2013.01); *H10D 30/031* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01); *H10D 64/021* (2025.01)

(58) Field of Classification Search
CPC ......... H01L 29/66545; H01L 29/66553; H01L 29/6656; H01L 29/0673; H01L 21/0259; H10D 30/6713; H10D 30/031; H10D 30/6729; H10D 30/6735; H10D 30/6757; H10D 62/118; H10D 64/017; H10D 64/018; H10D 64/021
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Shih Tsun A Chou
(74) *Attorney, Agent, or Firm* — HAYNES AND BOONE, LLP

(57) ABSTRACT

An inner sidewall spacer is formed before the formation of the epitaxial source/drain features and an outer sidewall spacer is formed after the epitaxial source/drain features. The two-level sidewall spacer design increases volume of the epitaxial source/drain features, thus improving ion performance. The thicker sidewall spacers also reduce capacitance between source/drain contacts and the gate electrode. In some embodiments, semiconductor nanosheets may be etched to reduce thickness prior to forming replacement gate structures. Nanosheets with reduced thickness improve device swing performance, reduce DIBL effect without sacrificing the channel resistance and epitaxial growth margin.

20 Claims, 44 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,239,335 B2 | 2/2022 | Liaw |
| 2020/0044061 A1* | 2/2020 | Cheng ............... H01L 29/66439 |
| 2021/0036121 A1* | 2/2021 | Lim ................. H01L 29/78696 |

* cited by examiner

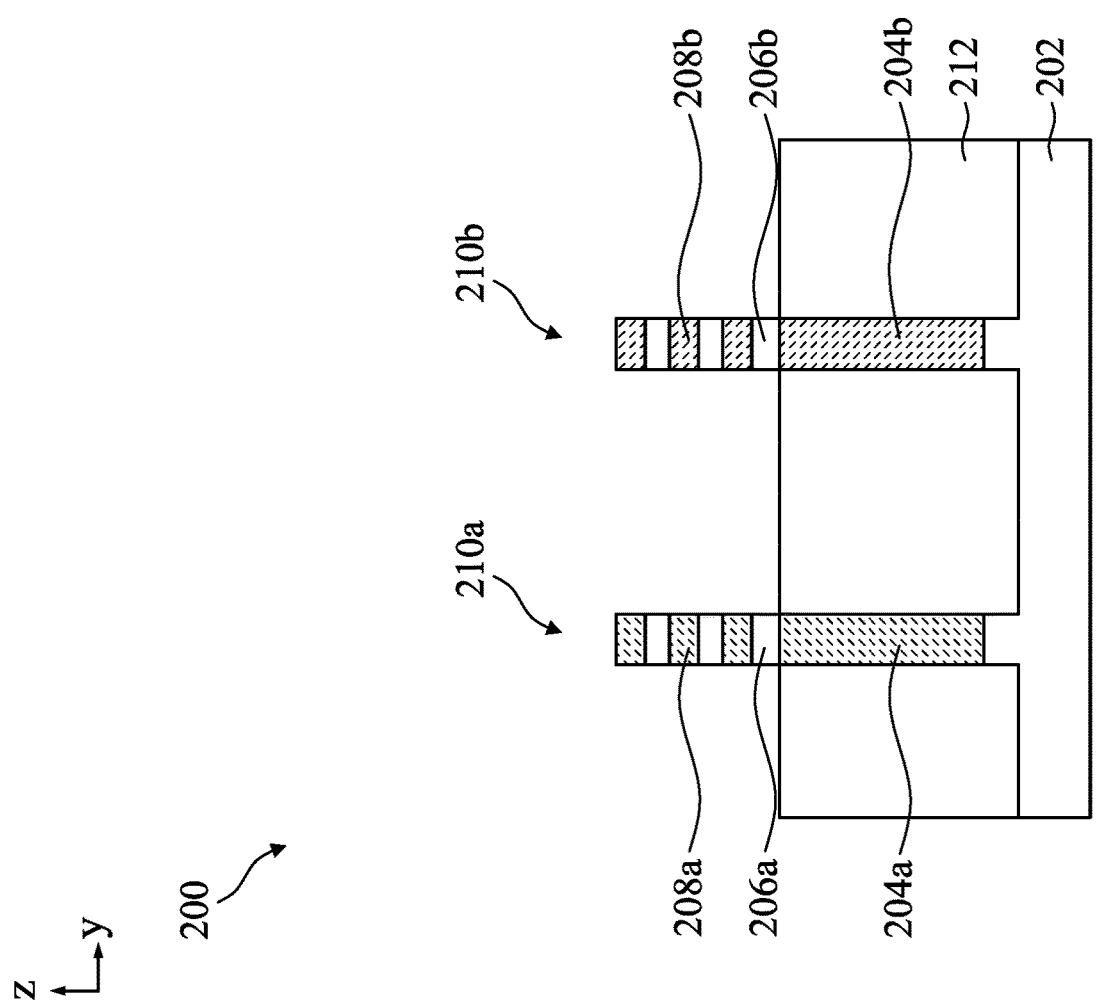

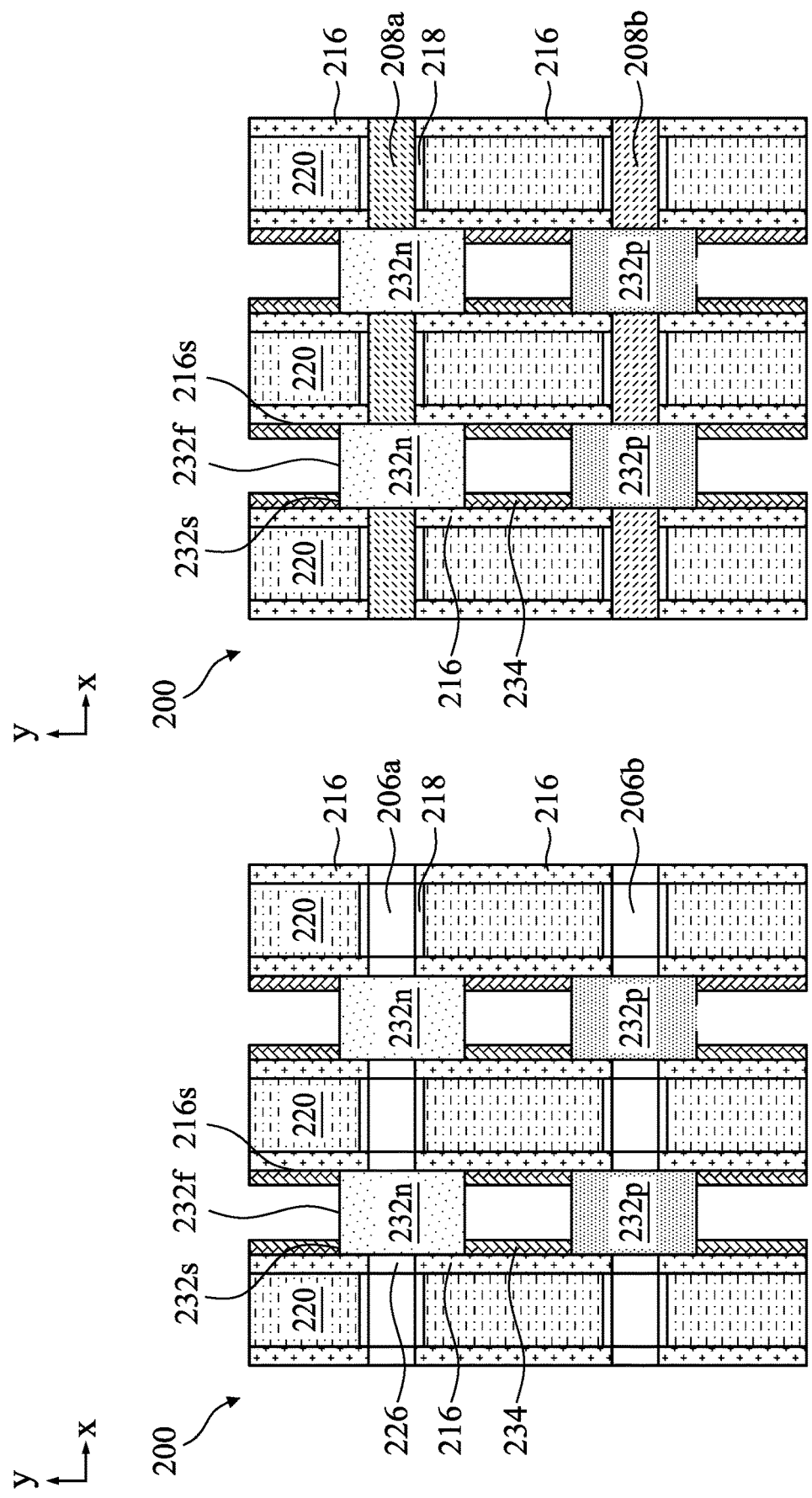

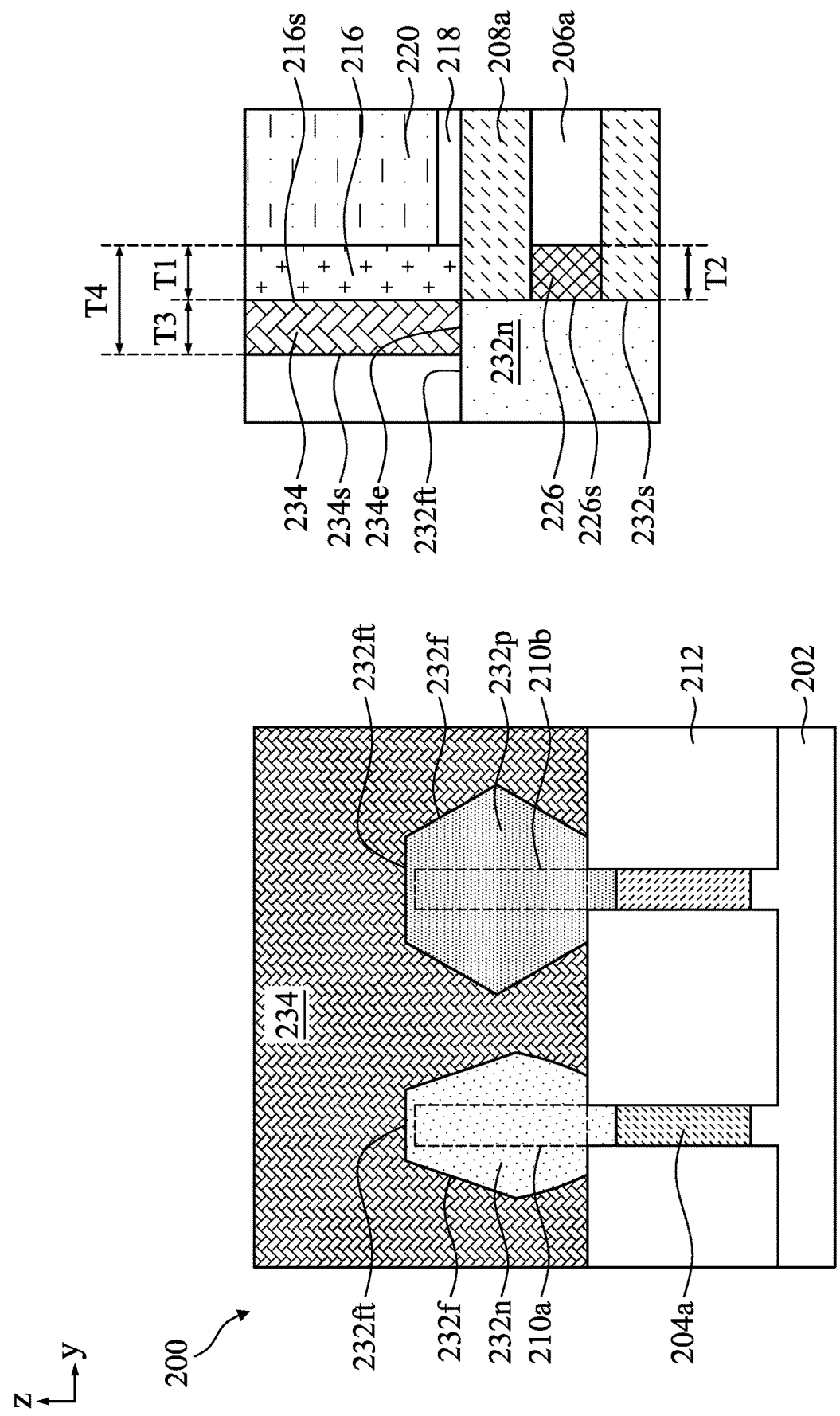

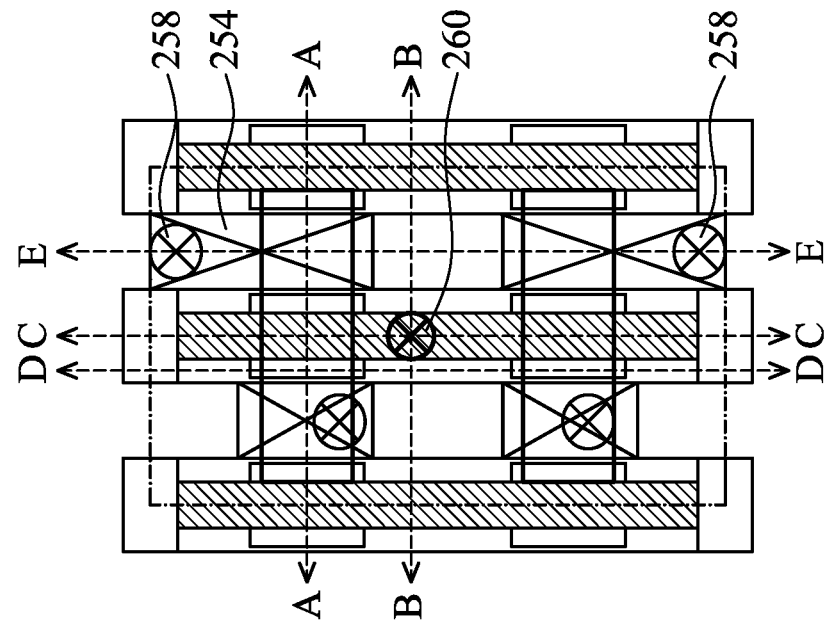
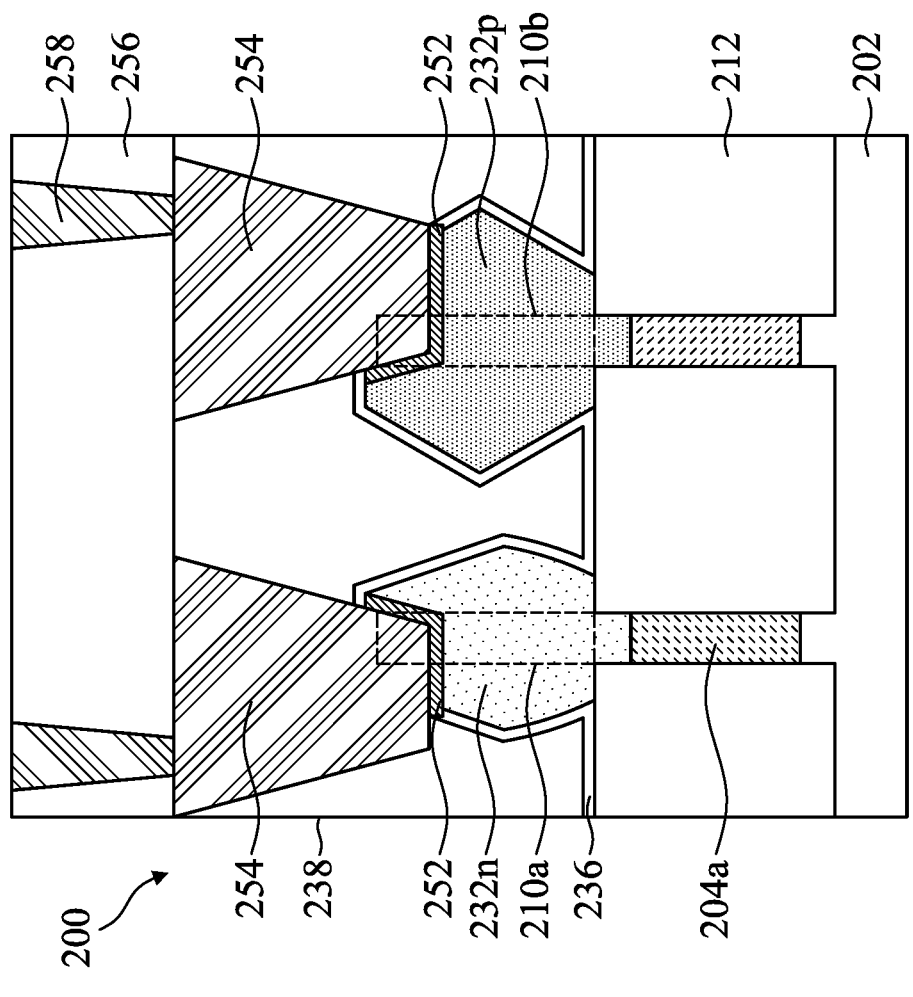
Fig. 14F
Fig. 14E

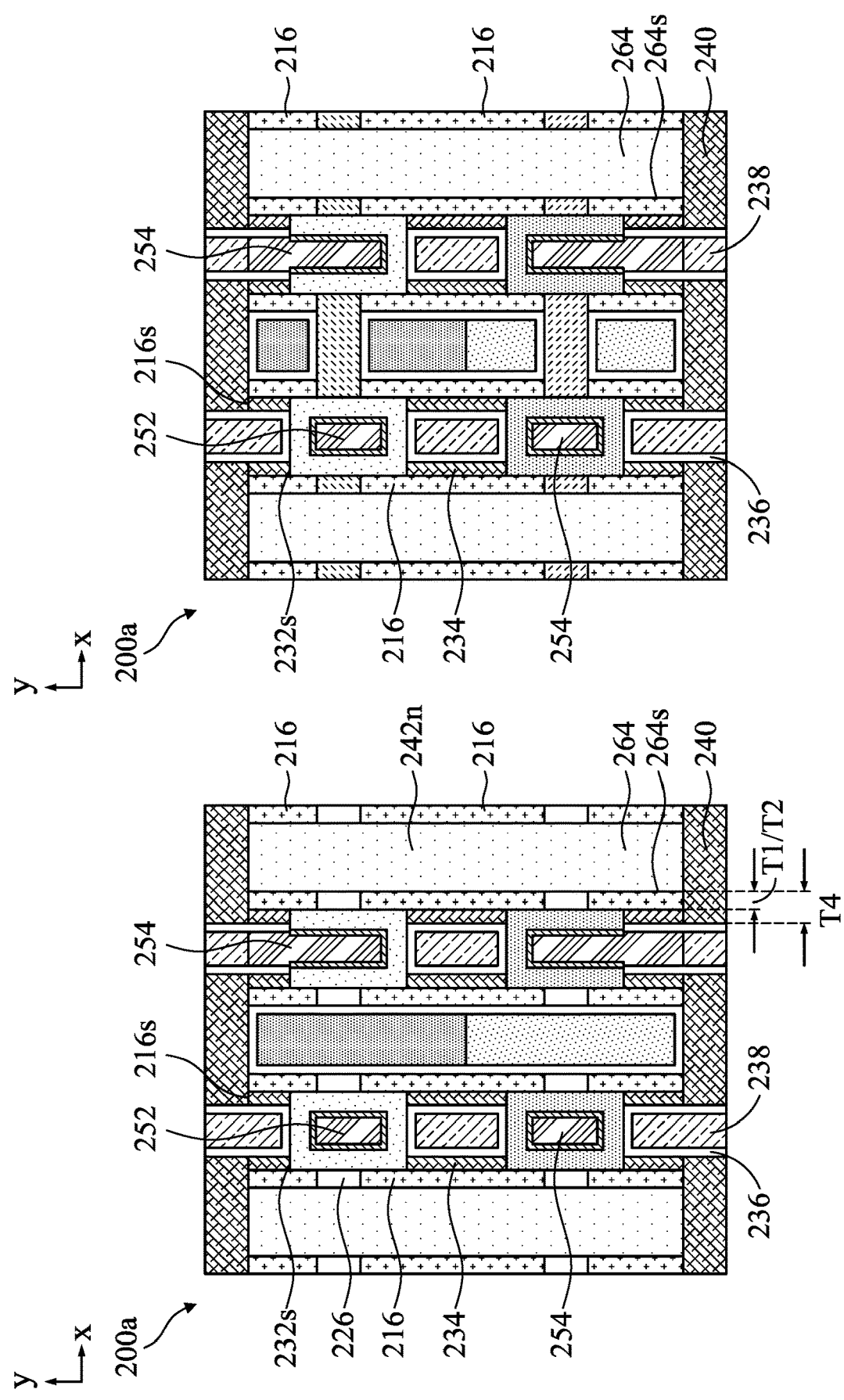

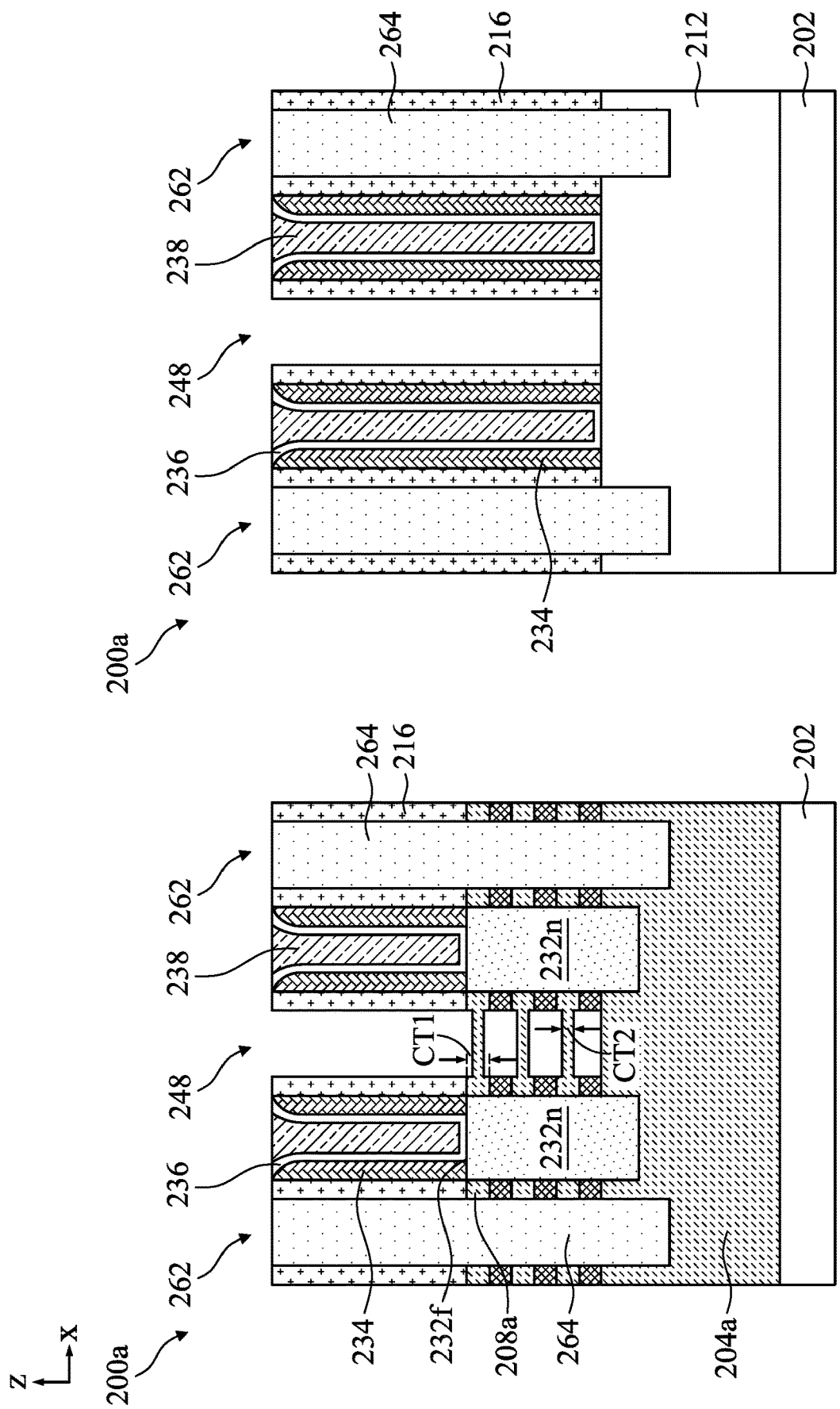

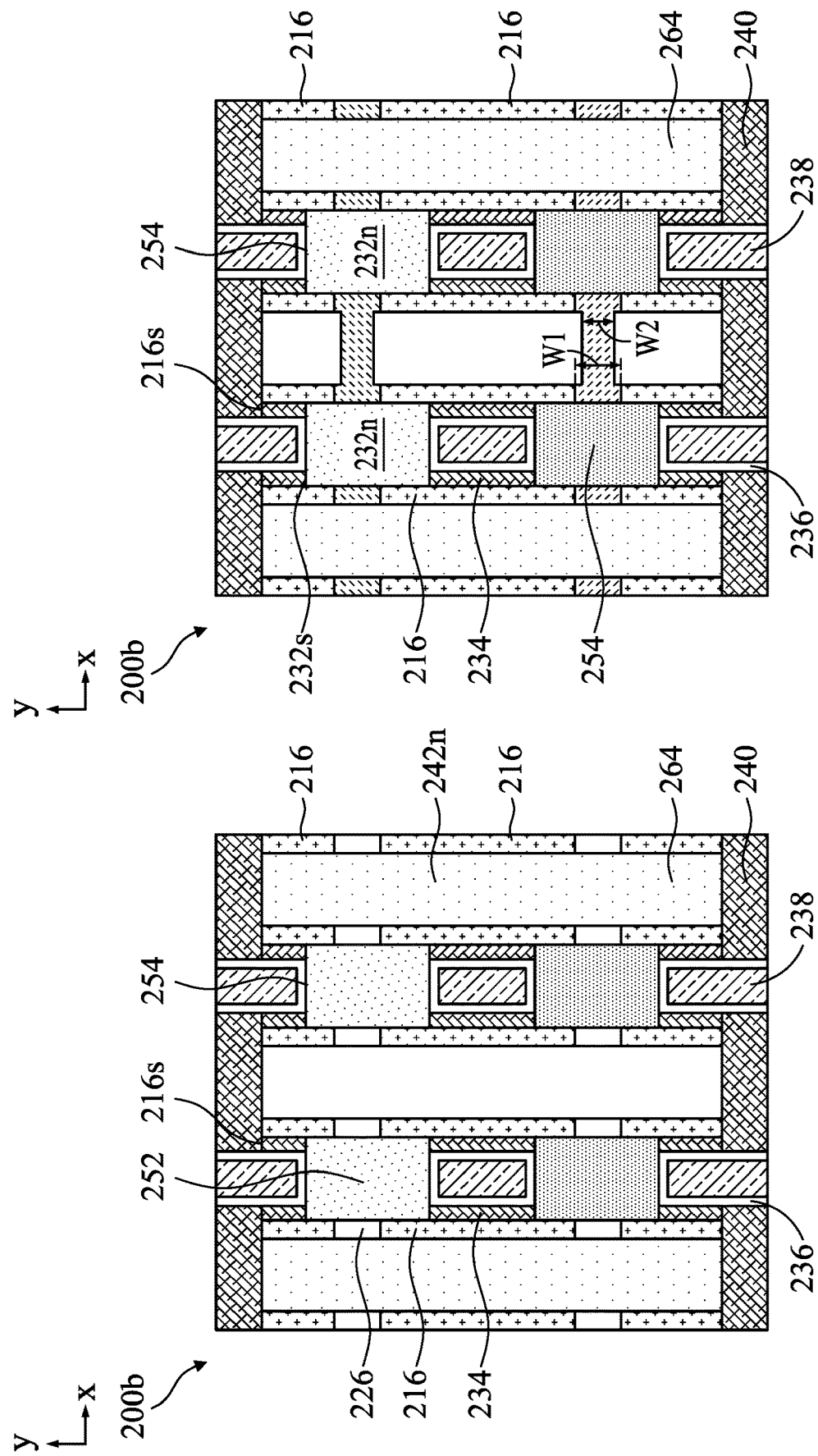

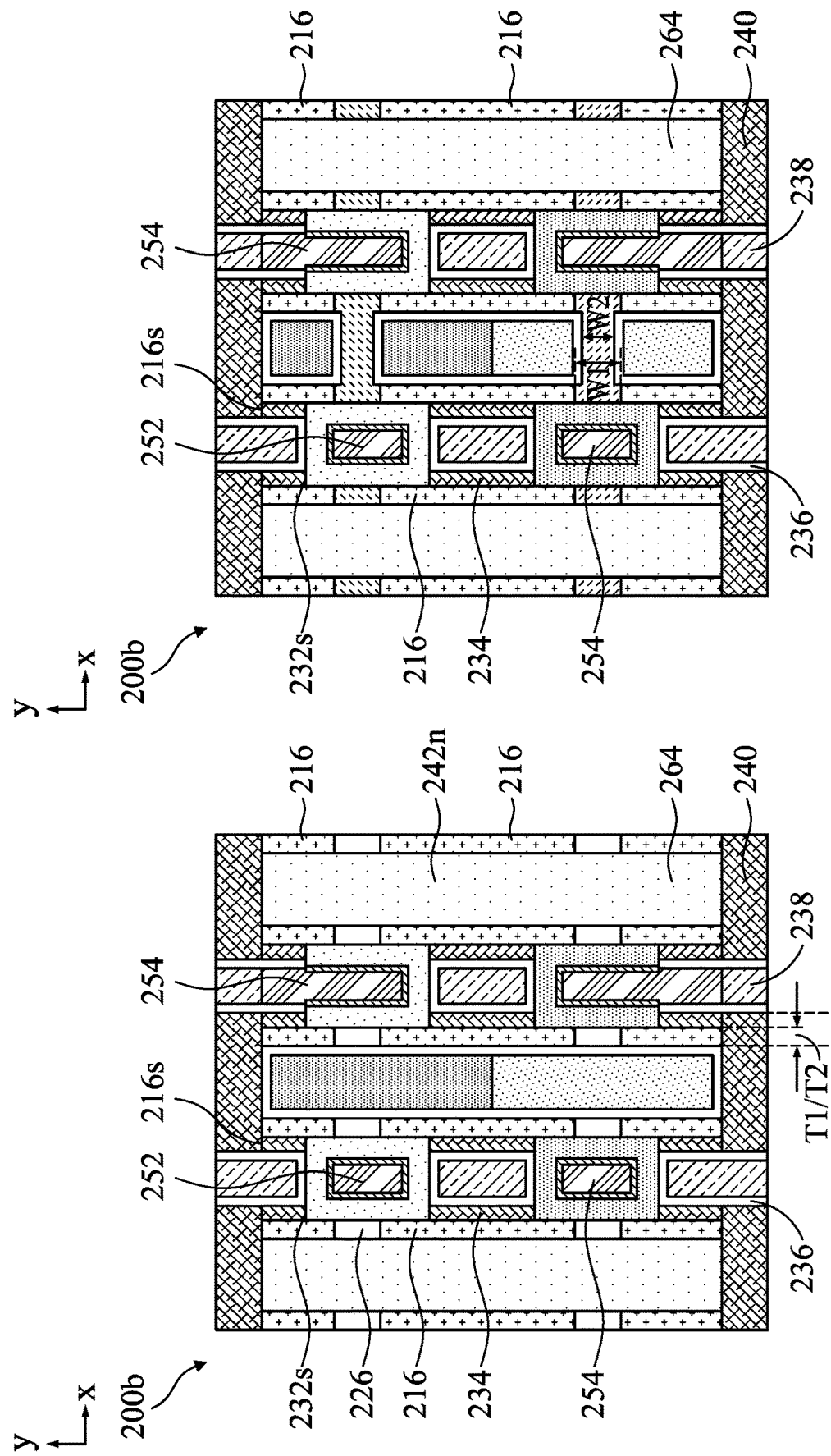

US 12,396,210 B2

SEMICONDUCTOR DEVICES AND METHODS FOR FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, resistance of source/drain features increases, which affect device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5, 5A-5E, 6A-6B, 7A-7O, 8A-8F, 9A-9F, 10A-10F, 11A-11F, 12A-12C 13A-13F, and 14A-14F schematically illustrate various stages of manufacturing a semiconductor device according to embodiments of the present disclosure.

FIGS. 15A-15B, and 16A-16H schematically illustrate a semiconductor device according to another embodiment of the present disclosure.

FIGS. 18A-18F and FIGS. 19A-H schematically illustrate various stages of semiconductor device fabricated according to the method of FIG. 17.

DETAILED DESCRIPTION

Figure 1:
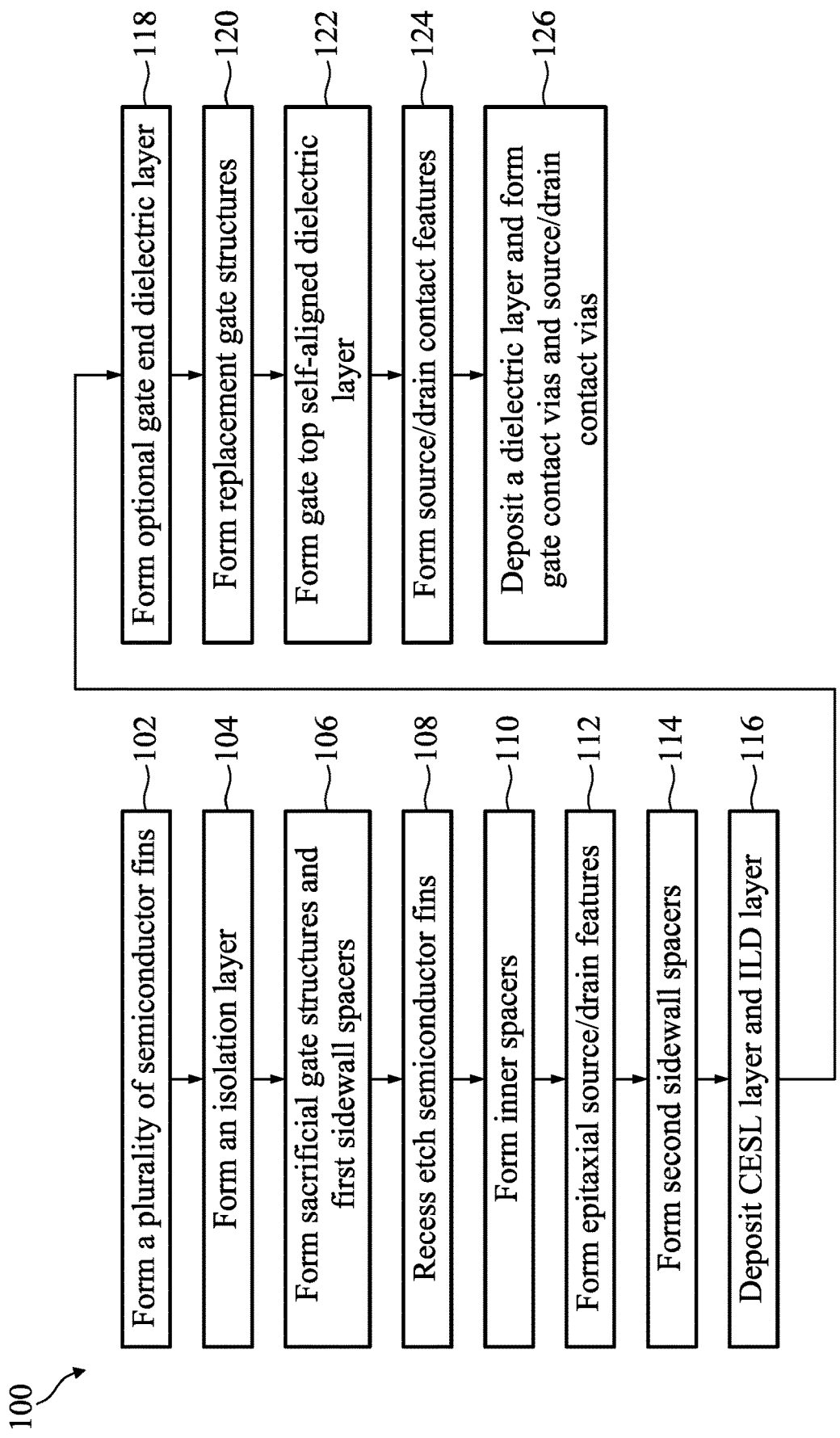
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a flow chart of a method 100 for manufacturing of a semiconductor device according to embodiments of the present disclosure. FIGS. 2-5, 5A-5E, 6A-6B, 7A-7O, 8A-8F, 9A-9F, 10A-10F, 11A-11F, 12A-12C, 13A-13F, and 14A-14F schematically illustrate various stages of manufacturing an exemplary semiconductor device 200 according to embodiments of the present disclosure. Particularly, the semiconductor device 200 may be manufactured according to the method 100 of FIG. 1.

Figure 2:
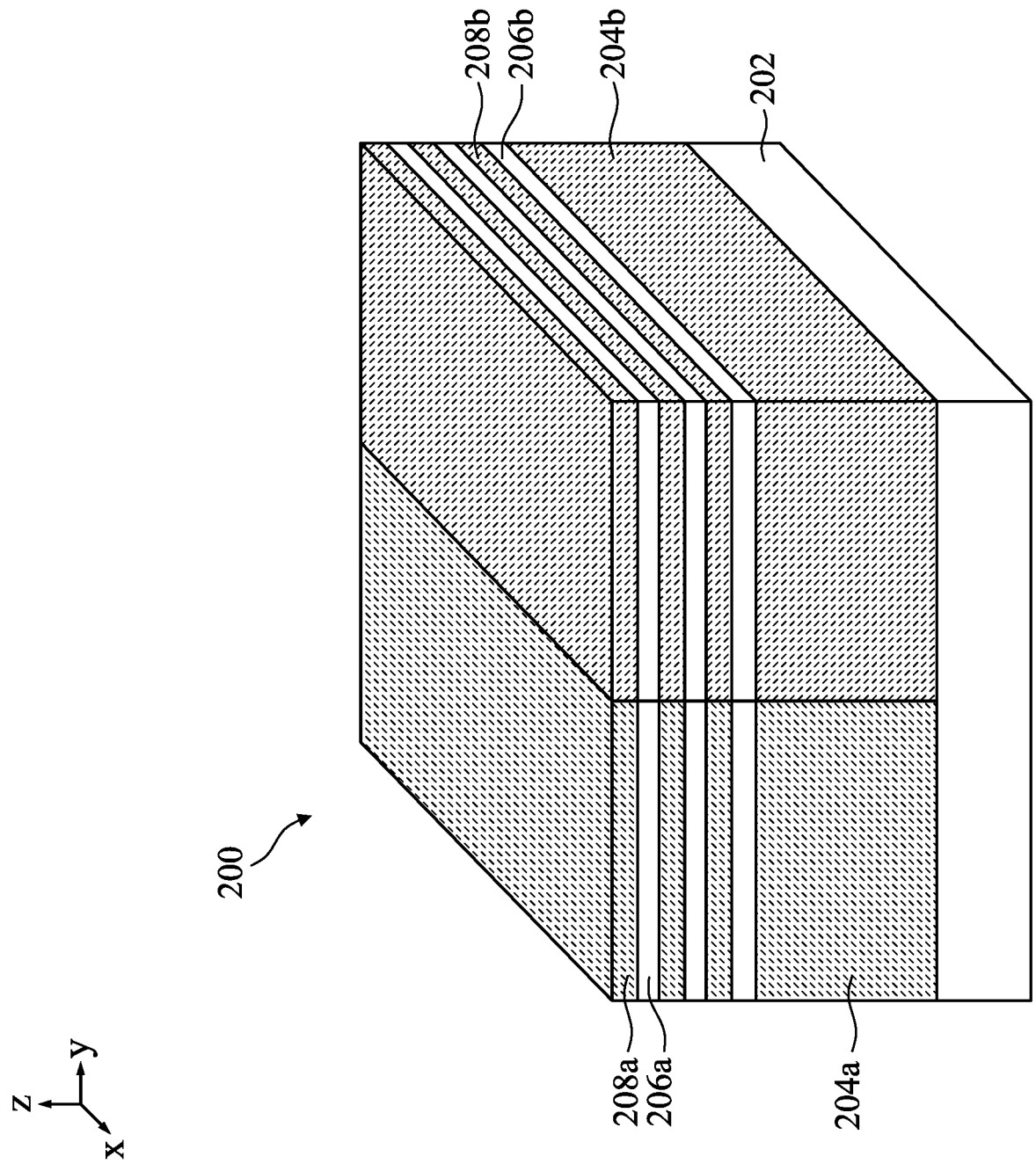
Figure 3:
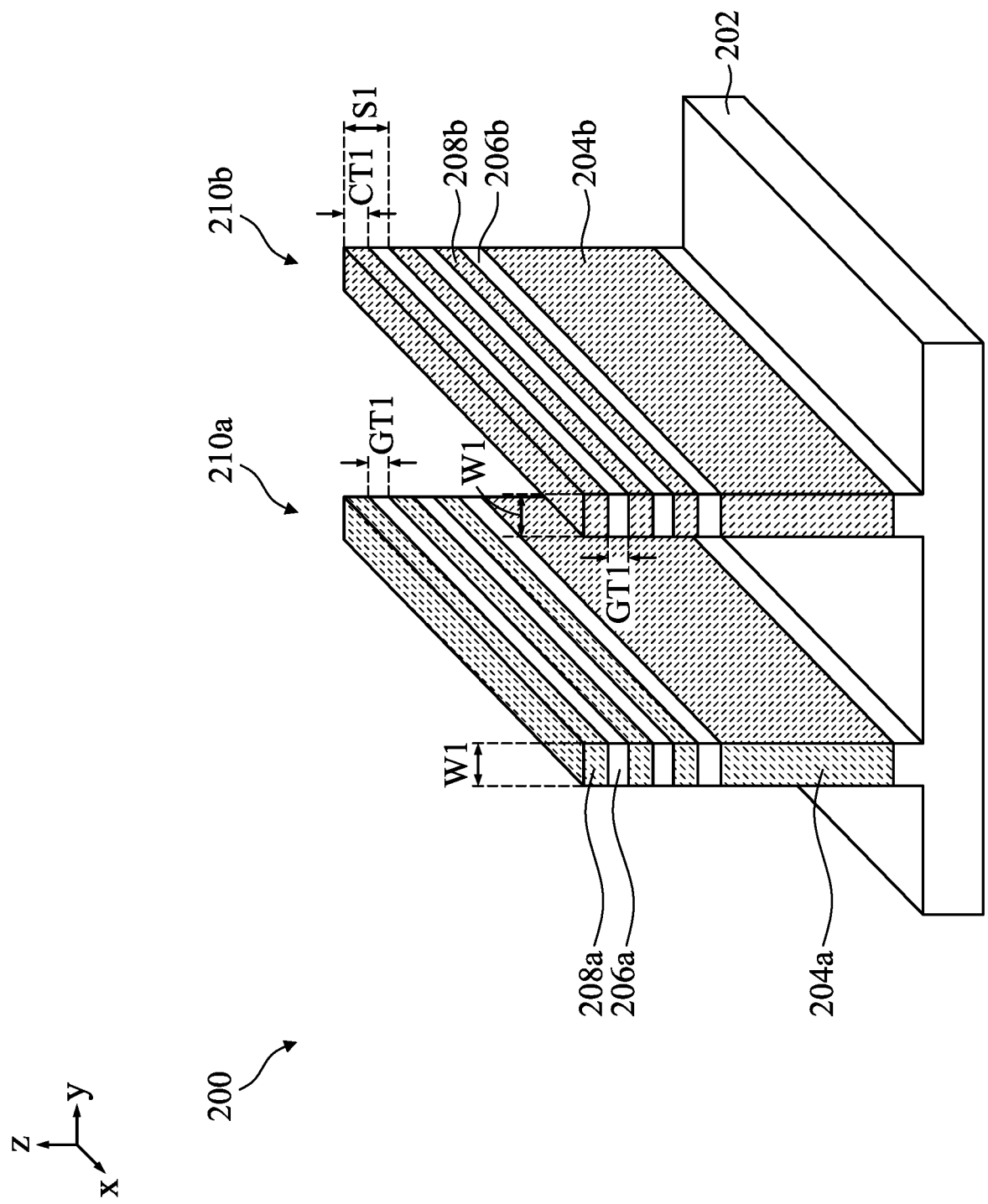

At operation 102 of the method 100, a plurality fin structures are formed on a substrate where a semiconductor device is to be formed. FIGS. 2 and 3 are schematic perspective view of the semiconductor device 200 during operation 102. As shown in FIG. 2, a substrate 202 is provided to form the semiconductor device 200 thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. In FIG. 2, the substrate 202 includes a p-doped region or p-well 204a and an n-doped region or n-well 204b. One or more n-type devices, such as nFETs, are to be formed over and/or within p-well 204a. One or more p-type devices, such as pFETs, are to be formed over and/or within n-well 204b. FIG. 2 shows that the p-well 204a is in a doped local region of a doped substrate, which is not limiting. In other embodiments, the p-well 204a and the n-well 204b may be separated by one or more insulation bodies, e.g., shallow trench insulation ("STI").

A semiconductor stack including alternating first semiconductor layers 206a and second semiconductor layers 208a is formed over the p-well 204a to facilitate formation of nanosheet channels in a multi-gate n-type device, such as nanosheet channel nFETs. The first semiconductor layers 206a and second semiconductor layers 208a have different compositions. In some embodiments, the two semiconductor layers 206a and 208a provide for different oxidation rates and/or different etch selectivity. In later fabrication stages, portions of the second semiconductor layers 208a form nanosheet channels in a multi-gate device. Four first semiconductor layers 206a and four second semiconductor layers 208a are alternately arranged as illustrated in FIG. 2 as an example. More or less semiconductor layers 206a and 208a may be included depending on the desired number of channels in the semiconductor device to be formed. In some embodiments, the number of semiconductor layers 206a and 208a is between 1 and 10.

In some embodiments, the first semiconductor layer 206a may include silicon germanium (SiGe). The first semiconductor layer 206a may be a SiGe layer including more than 25% Ge in molar ratio. For example, the first semiconductor layer 206a may be a SiGe layer including Ge in a molar ration in a range between 25% and 50%. The second semiconductor layer 208a may include silicon. In some embodiments, the second semiconductor layer 208a may be a Ge layer. The second semiconductor layer 208a may include n-type dopants, such as phosphorus (P), arsenic (As), etc.

Similarly, a semiconductor stack including alternating third semiconductor layers 206b and fourth semiconductor layers 208b is formed over the n-well 204b to facilitate formation of nanosheet channels in a multi-gate p-type device, such as nanosheet channel pFETs.

In some embodiments, the third semiconductor layer 206b may include silicon germanium (SiGe). The third semiconductor layer 206b may be a SiGe layer including more than 25% Ge in molar ratio. For example, the third semiconductor layer 206b may be a SiGe layer including Ge in a molar ration in a range between 25% and 50%. The fourth semiconductor layer 208b may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the fourth semiconductor layer 208b may be a Ge layer. The fourth semiconductor layer 208b may include p-type dopants, boron etc.

The semiconductor layers 206a, 206b, 208a, 208b may be formed by a molecular beam epitaxy (MBE) process, a metalorganic chemical vapor deposition (MOCVD) process, and/or other suitable epitaxial growth processes. The semiconductor stacks over the n-well 204b and the p-well 204a may be formed separately using patterning technology.

Fin structures 210a, 210b are then formed from etching the semiconductor stacks and a portion of the n-well 204b, the p-well 204a underneath respectively, as shown in FIG. 3. As shown in FIG. 3, each fin structure 210a, 210b has a width W1 along the y-direction. The width W1 may be selected according to circuit design. In some embodiments, the width W1 may be in a range between about 10 nm to about 200 nm. Portions of the semiconductor layers 208a, 208b function as channel regions connected between source/drain features in the semiconductor device to be formed. Each semiconductor layer 208a, 208b may have a thickness CT1 along the z-direction. In some embodiments, the thickness CT1 is in a range between about 4 nm and about 10 nm The semiconductor layers 206a, 206b serve to define a vertical distance between adjacent channel regions formed by the semiconductor layers 208a, 208b for a subsequently formed device. Each semiconductor layer 206a, 206b may have a thickness GT1 along the z-direction. In some embodiments, the thickness GT1 of the semiconductor layers 206a, 206b is equal to or greater than the thickness CT1 of the semiconductor layer 208a, 208b. In some embodiments, the thickness GT1 is in a range between about 6 nm and about 25 nm. A channel spacing S1 may be in a range between 10 nm and 23 nm.

Figure 4:
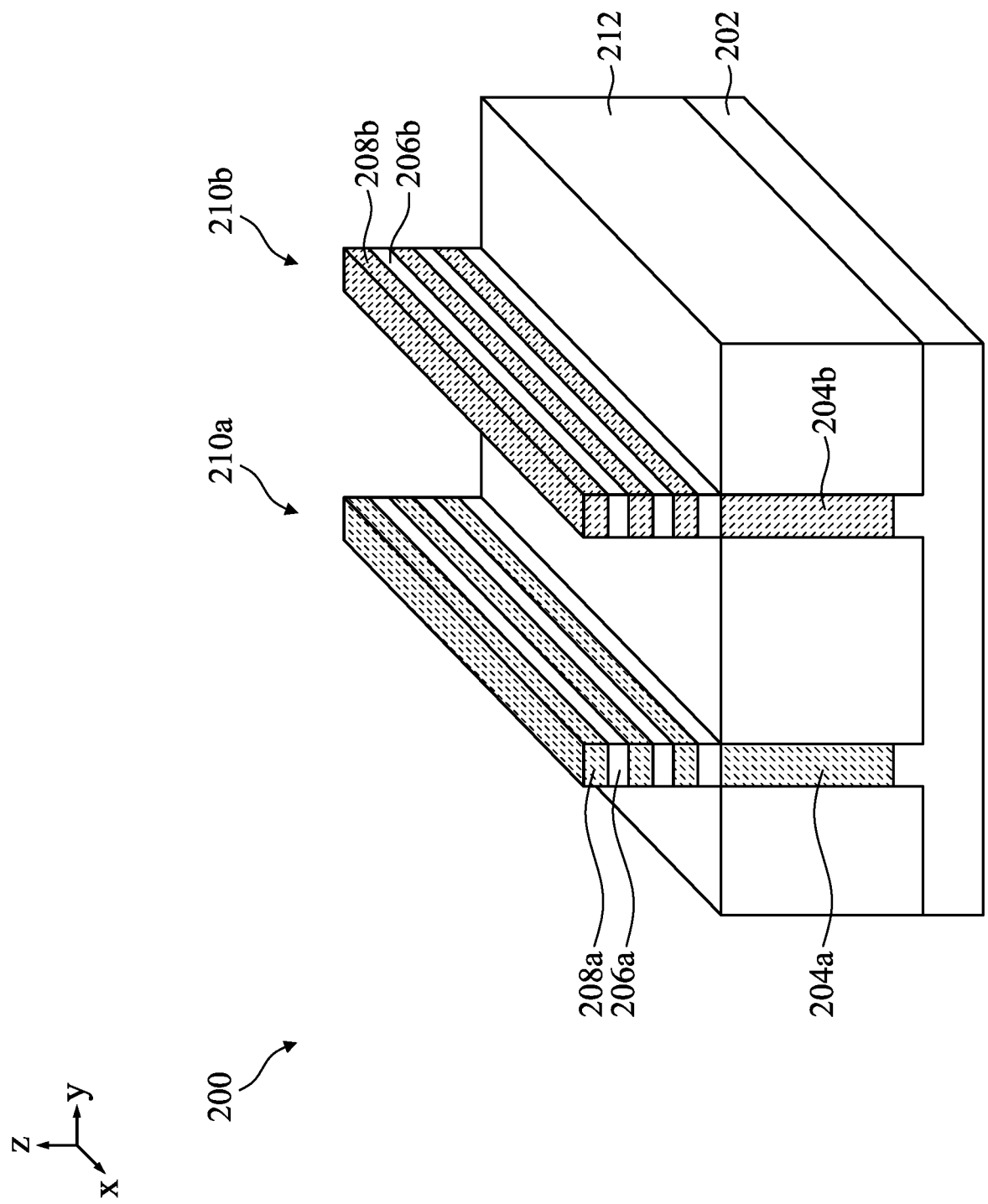

At operation 104, an isolation layer 212 is formed as shown in FIG. 4, which is a schematic view of the semiconductor device 200. The isolation layer 212 is filled in the trenches between the fin structures 210a, 210b and then etched back to below the semiconductor stacks of the fin structures 210a, 210b. The isolation layer 212 may be formed by a high density plasma chemical vapor deposition (HDP-CVD), a flowable CVD (FCVD), or other suitable deposition process. In some embodiments, the isolation layer 212 may include silicon oxide, silicon nitride, silicon oxynitride, fluorine-doped silicate glass (FSG), a low-k dielectric, combinations thereof. In some embodiments, the isolation layer 212 is formed to cover the fin structures 210a, 210b by a suitable deposition process to fill the trenches between the fin structures 210a, 210b, and then recess etched using a suitable anisotropic etching process to expose the active portions of the fin structures 210a, 210b.

Figure 5:
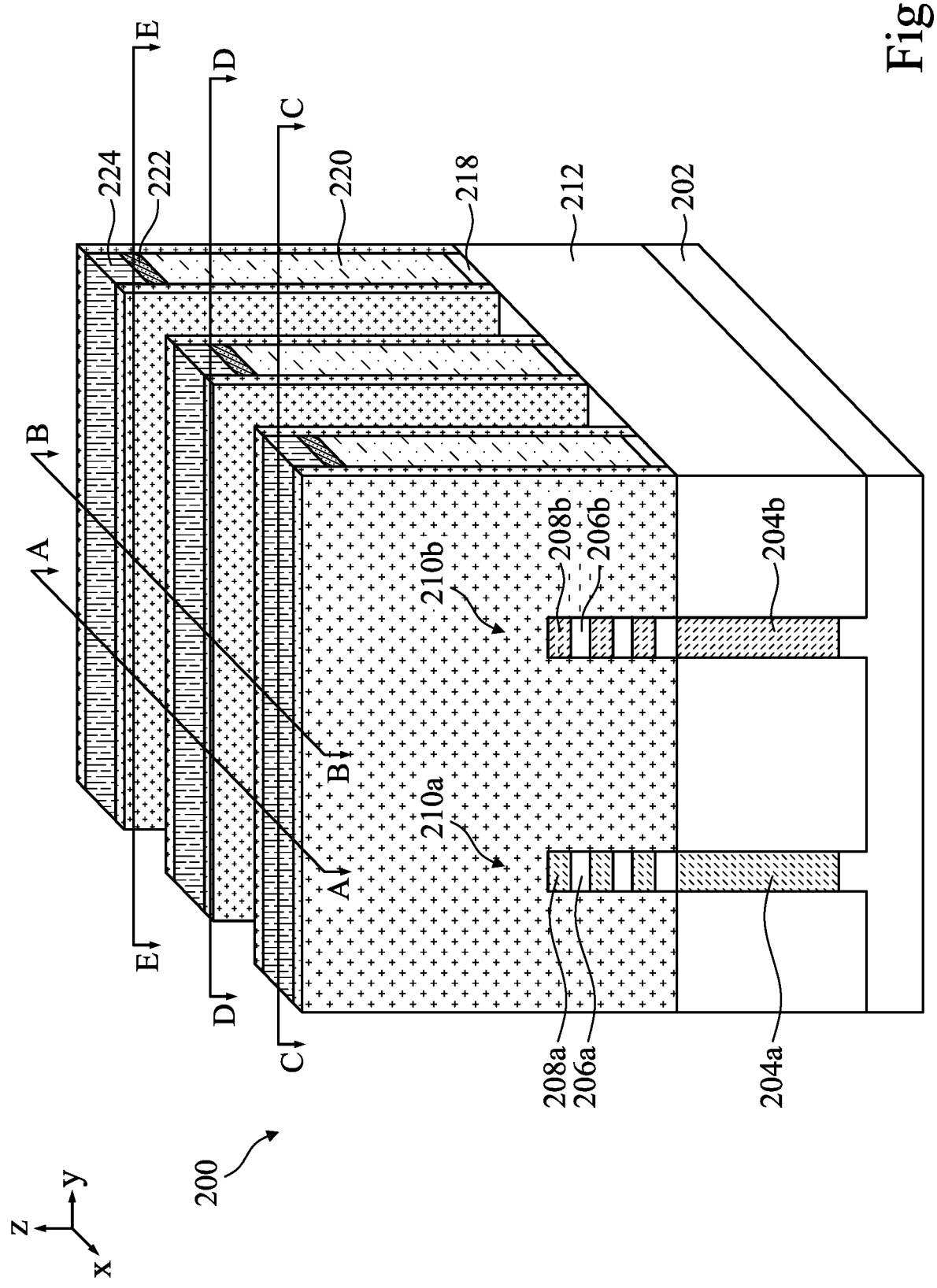
Figures 5A, 5B:
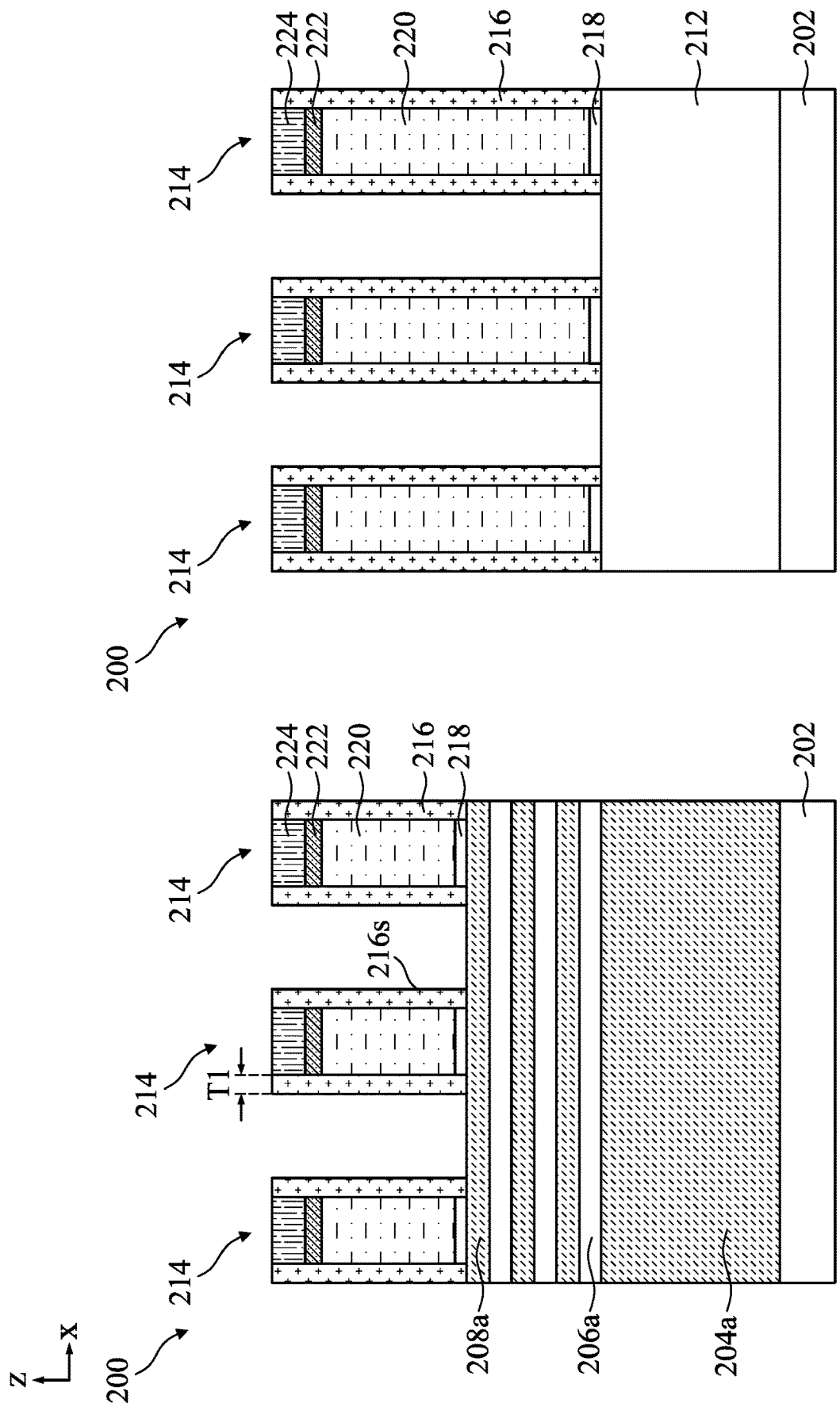
Figure 5C:
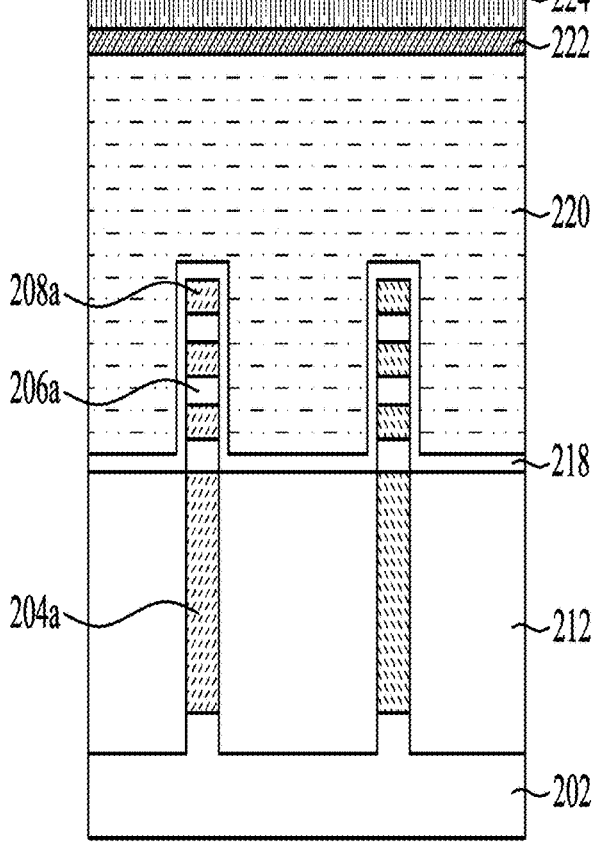
Figure 5D:
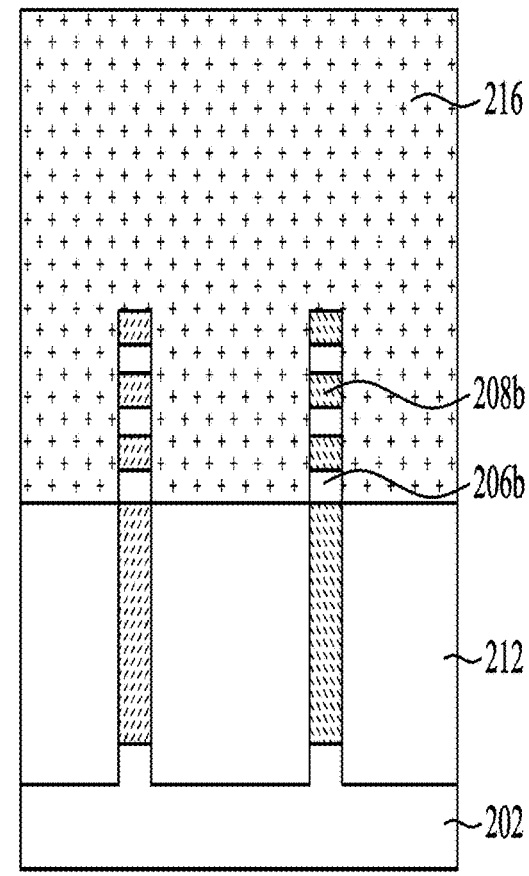

At operation 106, sacrificial gate structures 214 are formed over the isolation layer 212 and over the exposed portions of the fin structures 210a, 210b, and inner sidewall spacers 216 are formed on sidewalls of the sacrificial gate structures 214, as shown in FIGS. 5, and 5A-5E. FIG. 5 is a schematical perspective view of the semiconductor device 200. FIG. 5A is a schematic sectional view of the semiconductor device 200 along line A-A in FIG. 5. FIG. 5B is a schematic sectional view of the semiconductor device 200 along line B-B in FIG. 5. FIG. 5C is a schematic sectional view of the semiconductor device 200 along line C-C in FIG. 5. FIG. 5D is a schematic sectional view of the semiconductor device 200 along line D-D in FIG. 5. FIG. 5E is a schematic sectional view of the semiconductor device 200 along line E-E in FIG. 5.

The sacrificial gate structures 214 are formed over portions of the fin structures 210a, 210b which are to be channel regions. The sacrificial gate structures 214 may include a sacrificial gate dielectric layer 218, a sacrificial gate electrode layer 220, a pad layer 222, and a mask layer 224.

The sacrificial gate dielectric layer 218 may be formed conformally over the fin structures 210a, 210b, and the isolation layer 212. In some embodiments, the sacrificial gate dielectric layer 218 may be deposited by a CVD process, a sub-atmospheric CVD (SACVD) process, a FCVD process, an ALD process, a PVD process, or other suitable process. The sacrificial gate dielectric layer 218 may include one or more layers of dielectric material, such as SiO$_2$, SiN, a high-k dielectric material, and/or other suitable dielectric material.

The sacrificial gate electrode layer 220 may be blanket deposited on the over the sacrificial gate dielectric layer 218. The sacrificial gate electrode layer 220 includes silicon such as polycrystalline silicon or amorphous silicon. The thickness of the sacrificial gate electrode layer is in a range between about 42 nm and about 200 nm. In some embodiments, the sacrificial gate electrode layer 220 is subjected to a planarization operation. The sacrificial gate electrode layer 220 may be deposited using CVD, including LPCVD and PECVD, PVD, ALD, or other suitable process.

Subsequently, the pad layer 222 and the mask layer 224 are formed over the sacrificial gate electrode layer 220. The pad layer 222 may include silicon nitride. The mask layer 224 may include silicon oxide. Next, a patterning operation is performed on the mask layer 224, the pad layer 222, the sacrificial gate electrode layer 220 and the sacrificial gate dielectric layer 218 to form the sacrificial gate structures 214.

The inner sidewall spacers 216 are formed on sidewalls of each sacrificial gate structures 214, as shown in FIGS. 5A, 5B, and 5D. After the sacrificial gate structures 214 are formed, the inner sidewall spacers 216 are formed on sidewalls of the sacrificial gate structures 214, as shown in FIGS. 5A and 5B. The inner sidewall spacers 216 has a thickness T1 along the x-direction and cover a portion of the fin structures 210a, 210b. In some embodiments, the thickness T1 may be in a range between about 3 nm and about 12 nm. In some embodiments, the thickness T1 is selected to correspond with a thickness of inner spacers to be formed in the fin structures 210a, 210b under the sacrificial gate structures 214. FIG. 5D is a sectional view along one of the inner sidewall spacers 216. As shown in FIG. 5D, the inner sidewall spacers 216 are in contact with the fin structures 210a, 210b.

In some embodiments, the inner sidewall spacers 216 is formed by a blanket deposition of one or more layers of insulating material. The insulation material may be deposited by any suitable deposition method. In some embodiments, the inner sidewall spacers 216 may be formed by ALD or CVD. In some embodiments, the insulating material of the inner sidewall spacers 216 may include one or more dielectric material. In some embodiments, the insulating material of the inner sidewall spacers 216 may include dielectric material selected from silicon oxide, silicon nitride, such as Si$_3$N$_4$, carbon doped silicon oxide, nitrogen doped silicon oxide, porous silicon oxide, or combination thereof.

In some embodiments, the inner sidewall spacers 216 is subjected to anisotropic etching to remove the inner sidewall spacers 216 from horizontal surfaces, such as the top surface of the mask layer 224 and the top surface of the isolation layer 212. In other embodiments, the inner sidewall spacers 216 on the horizontal surfaces may be removed during fin structure etch back in operation 108 discussed below.

Figures 6A, 6B:
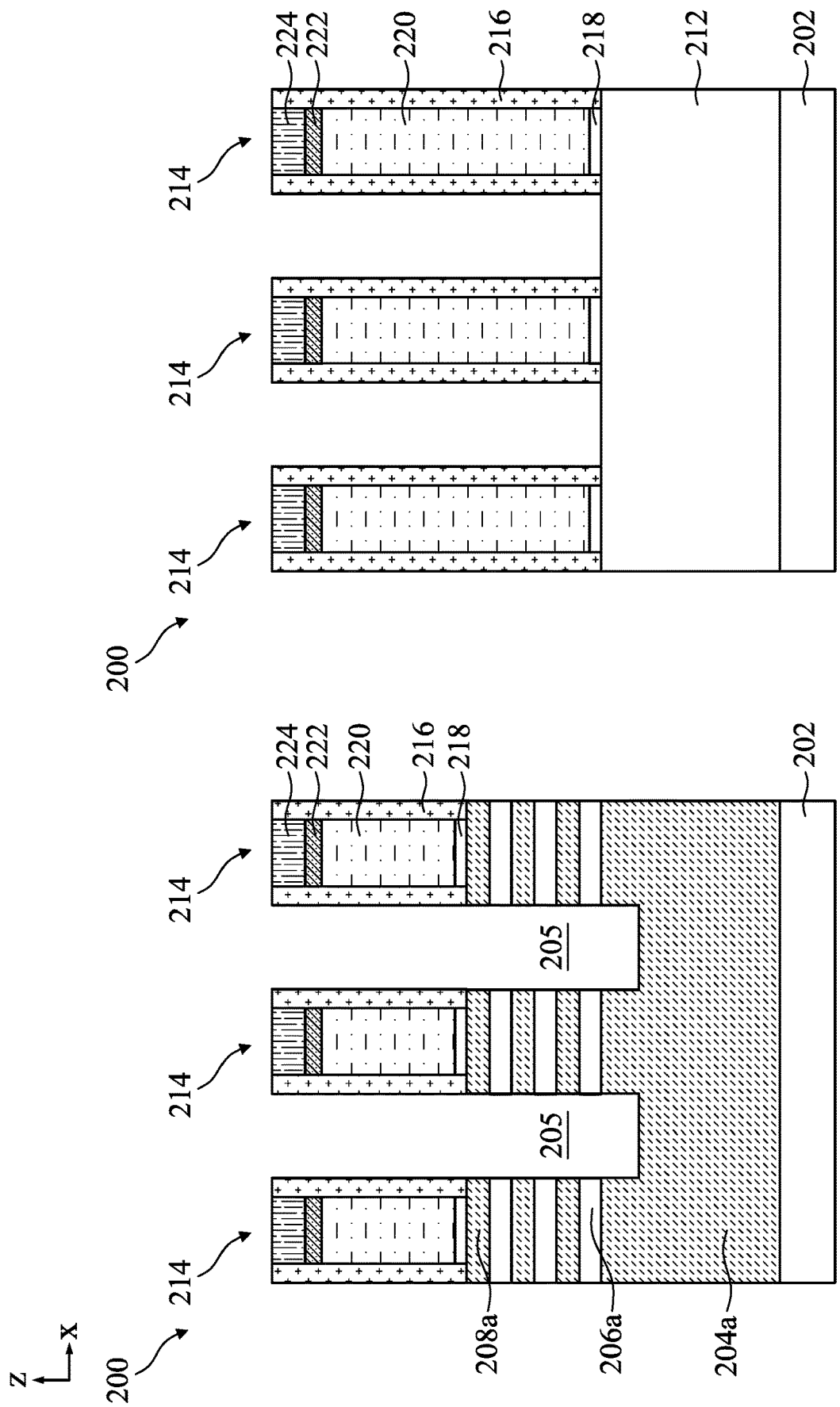

At operation 108, the fin structures 210a, 210b not covered by the sacrificial gate structures 24 are etched back, as shown in FIGS. 6A-63, which are schematic sectional views of the semiconductor device 200 along the lines A-A, B-B in FIG. 5 respectively. Even though described together in each operation, etching processes for regions for p-type devices, i.e. over the n-well 204b, and for n-type devices, i.e. over the p-well 204a, are sometimes performed separately using patterned masks and different processing recipes.

The fin structures 210a, 210b not covered by the sacrificial gate structures 214 and the inner sidewall spacers 216 are etched to expose well portions 204a, 204b of each fin structure 210a, 210b and form source/drain cavities 205. In some embodiments, suitable dry etching and/or wet etching may be used to remove the semiconductor layers 206a, 206b, 208a, 208b, together or separately.

Figures 7A, 7B:
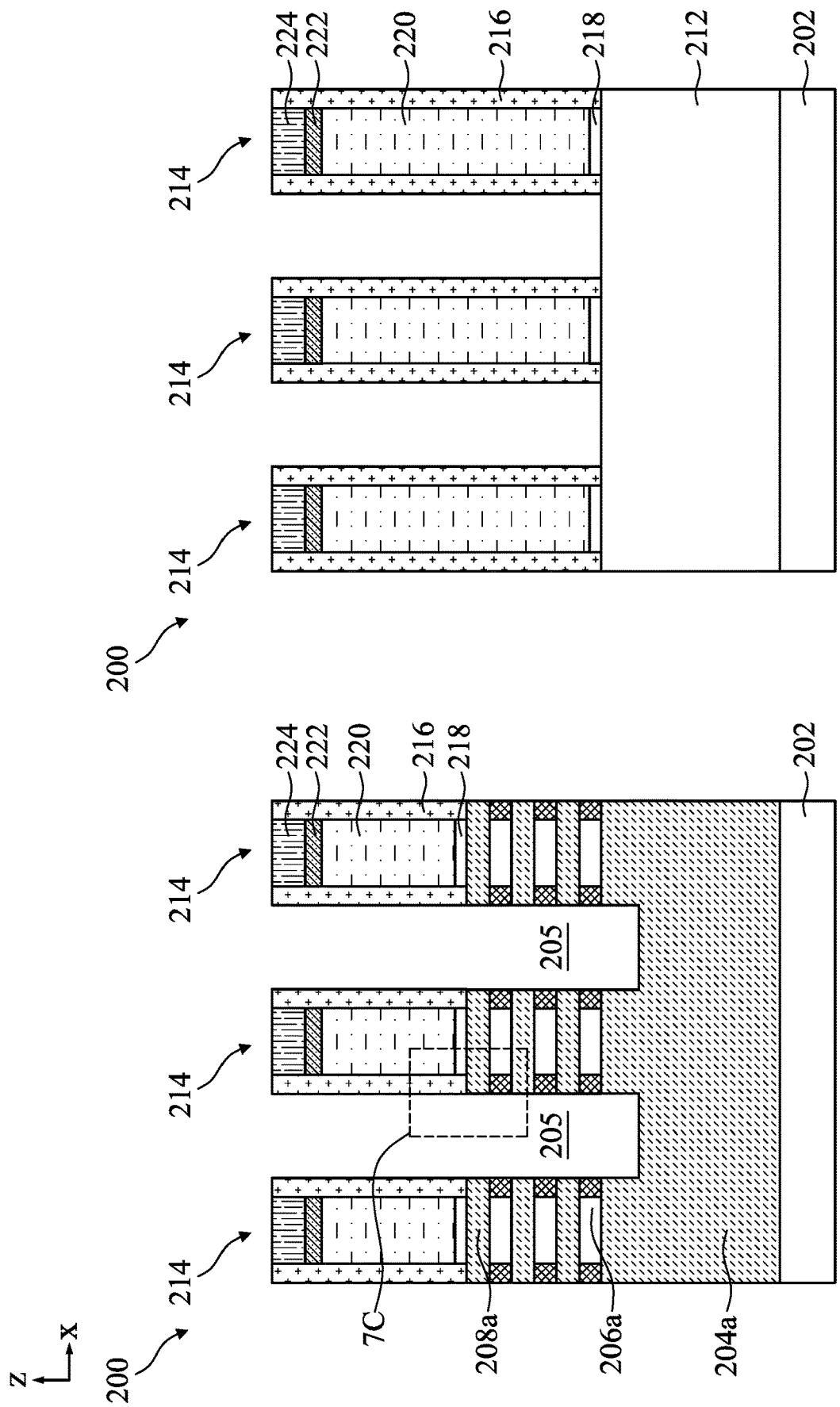
Figure 7C:
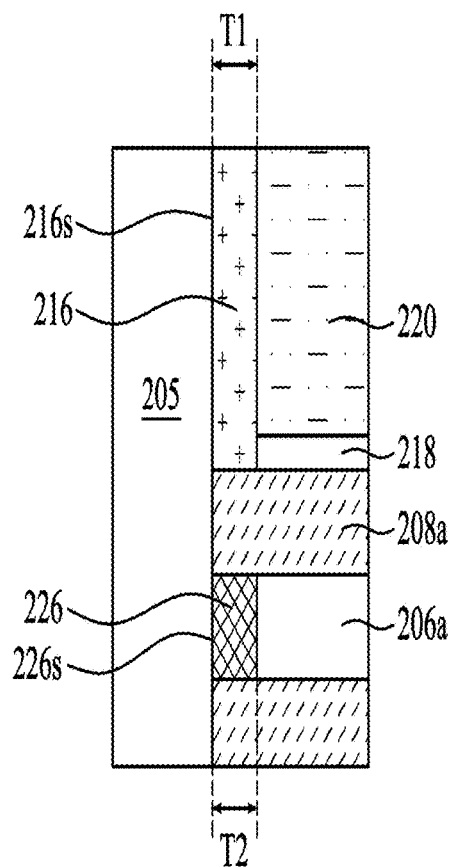
Figure 7D:
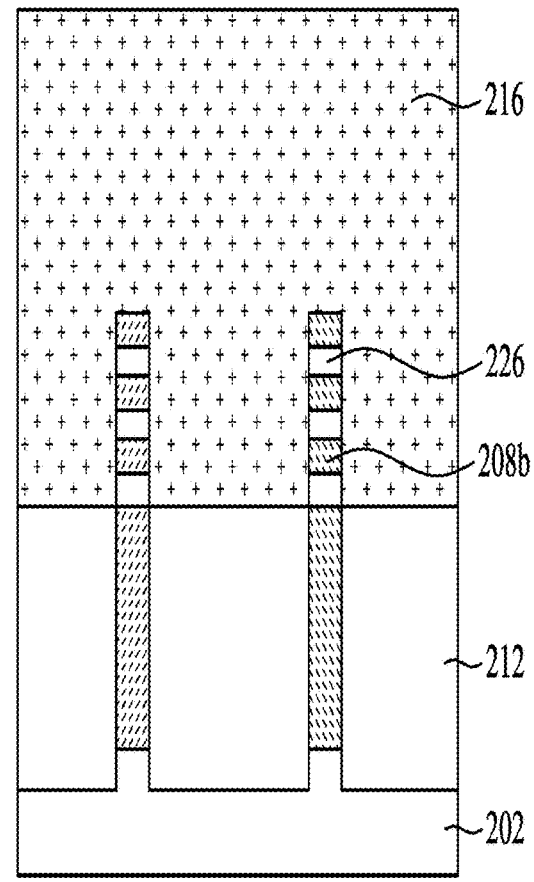

At operation 110, inner spacers 226 are formed as shown in FIGS. 7A-7D. FIGS. 7A, 7B, 7D are schematic sectional views of the semiconductor device 200 along the lines A-A, B-B, D-D in FIG. 5 respectively. FIG. 7C is a schematic partial enlarged view of the semiconductor device in an area 7C marked in FIG. 7A.

To form the inner spacers 226, the semiconductor layers 206a, 206b exposed to the source/drain cavities 205 are partially etched from the semiconductor layers 208a, 208b along the horizontal direction, or x-direction, to form inner spacer cavities under the inner sidewall spacers 216. In some embodiments, the semiconductor layers 206a, 206b can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

After forming the inner spacer cavities, the inner spacers 226 are formed in the inner spacer cavities by conformally deposit and then partially remove an insulating layer by an anisotropic etching process. The insulating layer can be formed by ALD or any other suitable method. The subsequent etch process removes most of the insulating layer except inside the cavities, resulting in the inner spacers 226. In some embodiments, the inner spacers 226 may include one or more dielectric material. In some embodiments, the inner spacers 226 may include dielectric materials, such as SiO$_2$, SiON, SiOC, or SiOCN based dielectric materials, air gaps, or combination thereof.

The inner spacers 226 and the inner sidewall spacers 216 may be formed from the same material or different material to achieve desired performance. In some embodiments, the inner spacers 226 may have a dielectric constant k lower than that of the inner sidewall spacer 216 to obtain a desired performance, for example, a low capacitance. In some embodiments, the inner spacers 226 may have a dielectric constant k higher than that of the inner sidewall spacer 216 to obtain a desired performance, for example, an increased device reliability.

As shown in FIG. 7C, the inner spacers 226 has a thickness T2 along the x-direction. In some embodiments, the thickness T2 of the inner spacers 226 is substantially similar to the thickness T1 of the inner sidewall spacers 216. In some embodiments, the thickness T2 may be in a range between about 3 nm and about 12 nm. A thickness T2 thinner than 3 nm may not provide enough isolation between subsequently formed source/drain features and the gate electrodes on opposite sides of the inner spacers 226. A thickness T2 greater than 12 nm may reduce a length of channel region without additional benefit. A side surface 216s of the inner sidewall spacer 216 faces the source/drain cavity 205. A side surface 226s of the inner spacer 226 also faces the source/drain cavity 205. In some embodiments, the side surface 216s of the inner sidewall spacer 216 and the side surface 226s of the inner spacer 226 are substantially coplanar in the y-z plane.

Figures 8A, 8B:
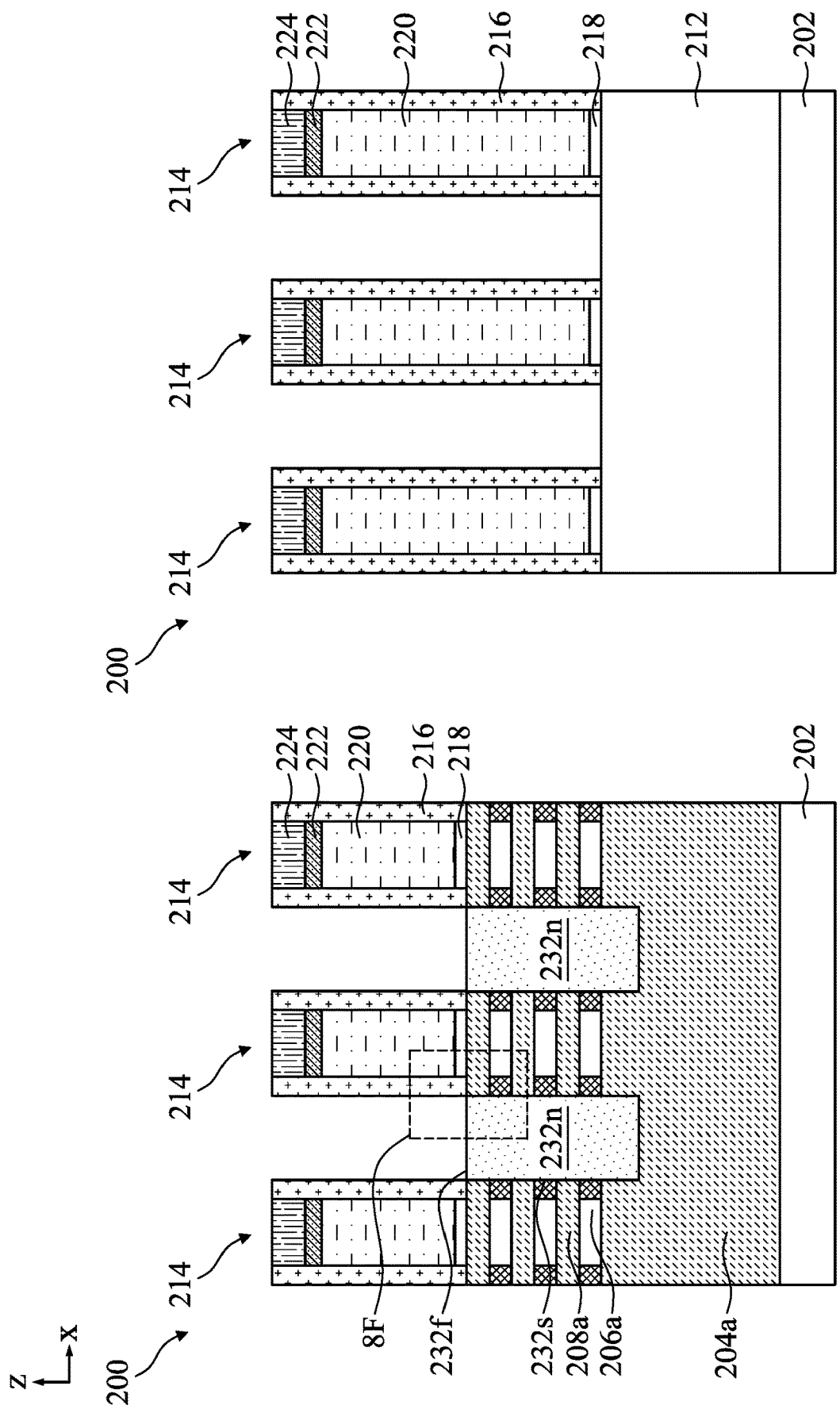
Figure 8C:
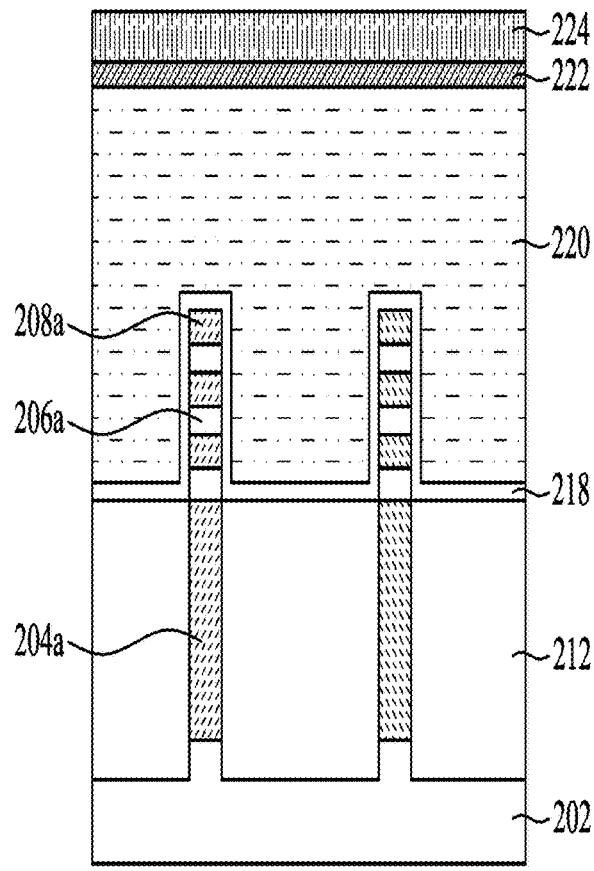
Figure 8D:
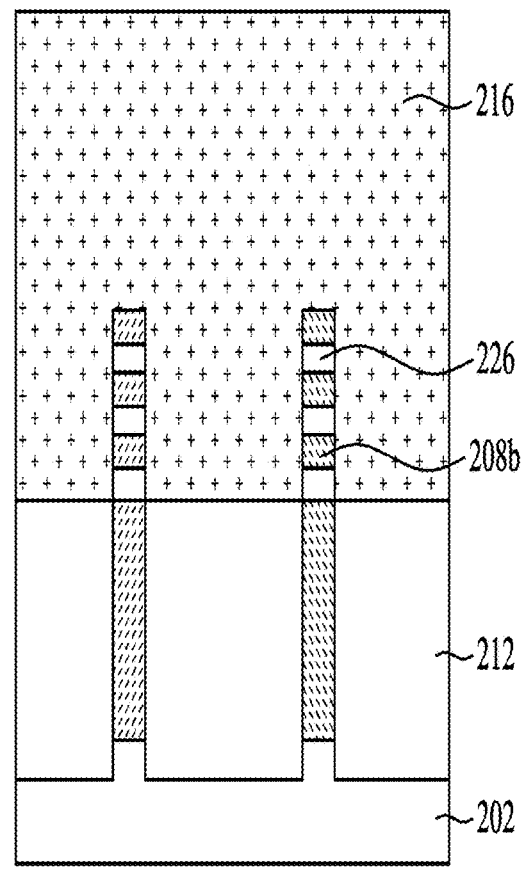
Figure 8F:
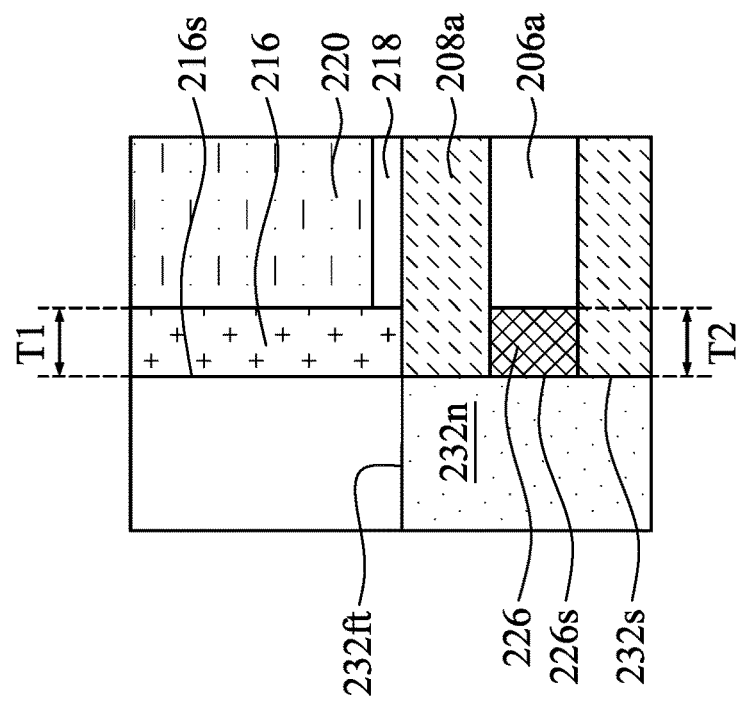

At operation 112, epitaxial source/drain features 232n, 232p are formed as shown in FIGS. 8A-8F. FIGS. 8A, 8B, 8C, 8D, 8E are schematic sectional views of the semiconductor device 200 along the lines A-A, B-B, C-C, D-D, E-E in FIG. 5 respectively. FIG. 8F is a schematic partial enlarged view of the semiconductor device in an area 8F marked in FIG. 8A. The epitaxial source/drain features 232n for N-type devices and the epitaxial source/drain features 232p for the P-type devices are epitaxially grown from exposed semiconductor surfaces of the fin structures 210a, 210b in the source/drain cavities 205.

The epitaxial source/drain features 232n for n-type devices may include one or more layers of Si, SiP, SiC and SiCP. The epitaxial source/drain features 232n also include N-type dopants, such as phosphorus (P), arsenic (As), etc. In some embodiments, the epitaxial source/drain features 232n may be a Si layer includes phosphorus (P) dopants. The epitaxial source/drain features 232n shown in FIG. 8E has a substantially oval shape in cross section. However, the epitaxial source/drain features 232n may be other shapes according to the design. The epitaxial source/drain features 232p for the p-type device may include one or more layers of Si, SiGe, Ge with p-type dopants, such as boron (B). In some embodiments, the epitaxial source/drain features 232p may be SiGe material including boron as dopant. The epitaxial source/drain features 232p shown in FIG. 8E has a substantially hexagon shape in cross section. However, the epitaxial source/drain features 232p may be other shapes according to the design. The epitaxial source/drain features 232n, 232p may be formed by any suitable method, such as by CVD, CVD epitaxy, molecular beam epitaxy (MBE), or any suitable deposition technique.

As shown in FIG. 8A, the epitaxial source/drain features 232n are epitaxially grown in the source/drain cavities 205 from exposed surfaces of the p-well 204a, and the semiconductor layer 208a. Similarly, the epitaxial source/drain features 232p are epitaxially grown in the source/drain cavities 205 from exposed surfaces of the n-well 204p, and the semiconductor layer 208b.

Figure 8E:
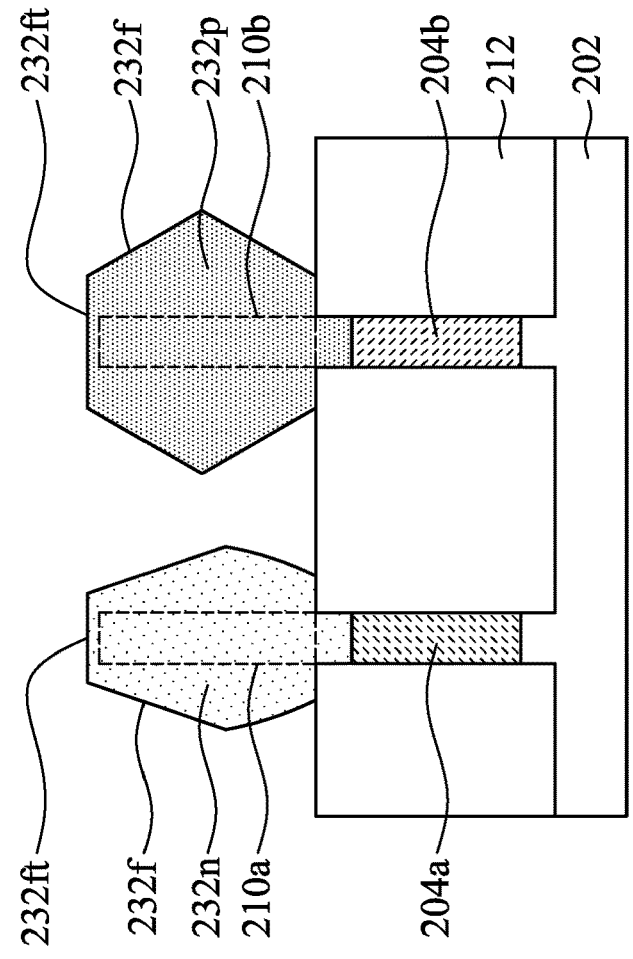

Each epitaxial source/drain features 232n, 232p also include various facet surfaces 232f resulting in from the growth of the crystalline structure. As shown in FIG. 8E, the facet surfaces 232f define the shape of the epitaxial source/drain features 232n, 232p in the cross section. After the operation 112, the facet surfaces 232f are generally exposed surfaces, Typically, a top surface 232 ft of the epitaxial source/drain features 232n, 232p is one of the facet surfaces 232f. In some embodiment of FIG. 8E, the top surface 232 ft is substantially horizontal to the x-y plane. Alternatively, the top surface 232 ft may have other orientation or may be a curved surface. In some embodiments, the top surface 232 ft may be in a higher vertical level, along the z-direction, than a topmost surface of the fin structures 210a, 210b.

Each epitaxial source/drain features 232n, 232p has two sides 232s facing the adjacent sacrificial gate structures 214. The various facet surfaces 232f connect between the two sides 232s. The sides 232s of the epitaxial source/drain features 232n, 232p are in contact with the semiconductor layers 208a, 208b, which function as channel regions in the resulting transistors. The sides 232s of the epitaxial source/drain features 232n, 232p are also in contact with the side surfaces 226s of the inner spacers 226 and the side surfaces 216s of the inner sidewall spacers 216. In FIG. 8E, the cross section of the fin structures 210a, 210b are shown in dashed lines. The side 232s in areas outside the dashed lines of the fin structures 210a, 210b are in contact with the side surface 216s of the inner sidewall spacers 216. As shown in FIG. 8F, the side surfaces 226s of the inner spacers 226 are covered with the side 232s of the adjacent epitaxial source/drain feature 232n or 232p.

As discussed above, operations 108, 110, and 112 may be performed separately for the n-type device and p-type device. For example, the operations 108, 110, and 112 may be first performed in the n-type device area while the p-type device area is covered by a photoresist layer and/or a mask layer, and the operations 108, 110, and 112 may be performed again in the p-type device area while the n-type device area is covered by a photoresist layer and/or a mask layer.

Figures 9A, 9B:
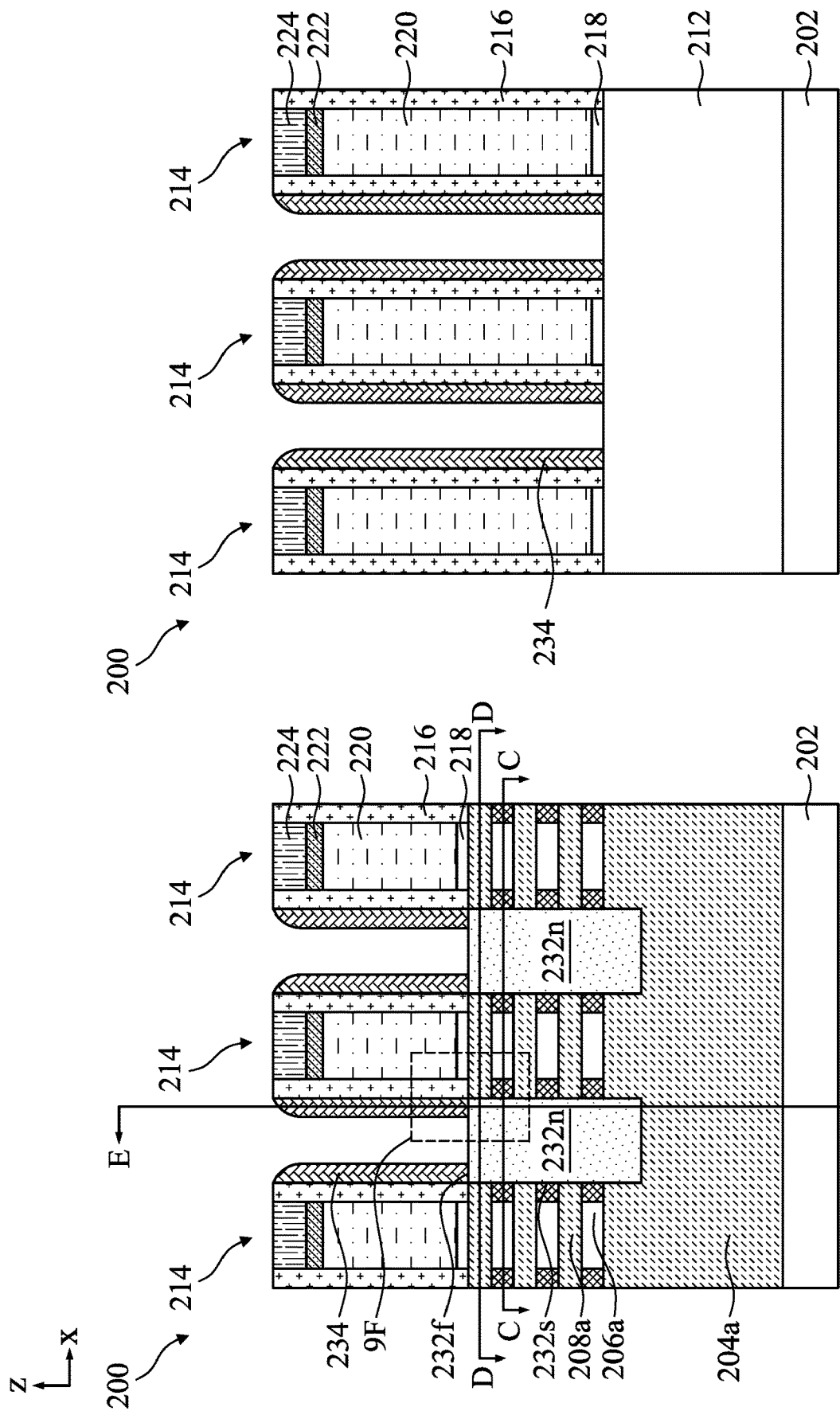

At operation 114, a outer sidewall spacers 234 are formed, as shown in FIGS. 9A-9F. FIGS. 9A, 9B are schematic sectional views of the semiconductor device 200 along the lines A-A, B-B in FIG. 5 respectively. FIGS. 9C, 9D, 9E are schematic sectional views of the semiconductor device 200 along the lines C-C, D-D, E-E in FIG. 9A respectively. FIG. 9F is a schematic partial enlarged view of the semiconductor device in an area 9F marked in FIG. 9A.

The outer sidewall spacers 234 are formed on exposed side surfaces 216s of the inner sidewall spacers 216, as shown in FIGS. 9A-9E. The outer sidewall spacers 234 increases overall thickness of sidewall spacers between subsequently formed gate electrodes and source/drain contact features. In some embodiments, the outer sidewall spacers 234 are formed by a blanket deposition of one or more layers of insulating material and a subsequent anisotropic etch process. The insulation material may be deposited by any suitable deposition method. In some embodiments, the outer sidewall spacers 234 may be formed by ALD or CVD. In some embodiments, the insulating material of the outer sidewall spacers 234 may include one or more dielectric material. In some embodiments, the insulating material of the outer sidewall spacers 234 may include dielectric material selected from silicon oxide, silicon nitride, such as $Si_3N_4$, carbon doped silicon oxide, nitrogen doped silicon oxide, porous silicon oxide, or combination thereof. In some embodiments, the inner sidewall spacers 216 and the outer sidewall spacers 234 may be formed from the same material. In other embodiments, the inner sidewall spacers 216 and the outer sidewall spacers 234 may be formed from different materials.

The outer sidewall spacers 234 is formed as an added thickness to the inner sidewall spacers 216 except for the portions of the inner sidewall spacers 216 that is disposed between the sacrificial gate structures 214 and the epitaxial source/drain features 232n, 232p, as shown in FIGS. 9C and 9D. FIG. 9E illustrates an area of the outer sidewall spacer 234 in the y-z plane. FIG. 8D illustrates an area of the inner sidewall spacer 216 in the y-z plane. The outer sidewall spacers 234 cover a smaller area in the y-z plane than the adjacent inner sidewall spacers 216. As shown in FIGS. 9A, 9E, and 9F, the outer sidewall spacers 234 contact the source/drain features 232n, 232p at end portions of the facet surfaces 232f. Each pair of inner sidewall spacer 216 and outer sidewall spacer 234 form a sidewall spacer function to provide insolation between conductive features on opposite sides. The sidewall spacer is characterized with having two level of thicknesses and contacting the source/drain features 232n, 232p on both the sides 232s and facet surfaces 232f.

The outer sidewall spacers 234 has a thickness T3 along the x-direction and cover a portion of the adjacent inner sidewall spacer 216. In some embodiments, the thickness T3 may be in a range between about 1 nm and about 12 nm. As shown in FIG. 9F, the inner sidewall spacers 216 and the outer sidewall spacers 234 may form a sidewall spacer having a total thickness T4 along the x-direction. In some embodiments, the total thickness T4 is in a range between about 4 nm and 15 nm. By selecting thicker sidewall spacers and thinner inner spacers, embodiments of the present disclosure improve performance of the transistors to be formed. For example, thicker sidewall spacers reduce capacitance between subsequently formed source/drain contact and gate electrode and improve device reliability, and thinner inner spacers increase volume of the source/drain features 232n, 232p, thus lowering source/drain resistance and improving ion performance, widening source/drain feature growth margin, and providing more compressive strain for hole mobility in P-type devices.

In some embodiments, the total thickness T4 is greater than the thickness T2 of the inner spacers 226. In some embodiments, the total thickness T4 may be greater than the thickness T2 in a range between about 1 nm and about 5 nm. A thickness difference lower than 1 nm would not provide enough benefit to justify forming the sidewall spacers in two separate operations, a thickness difference greater than 5 nm would reduce spaces for source/drain contact features without added benefit. In some embodiments, a ratio of the total thickness T4 over the thickness T2 may be in a range between 1.1 and 2.0. A ratio lower than 1.1 would not provide enough benefit to justify forming the sidewall spacers in two separate operations, a ratio greater than 2 would reduce spaces for source/drain contact features without added benefit.

Figure 10A:
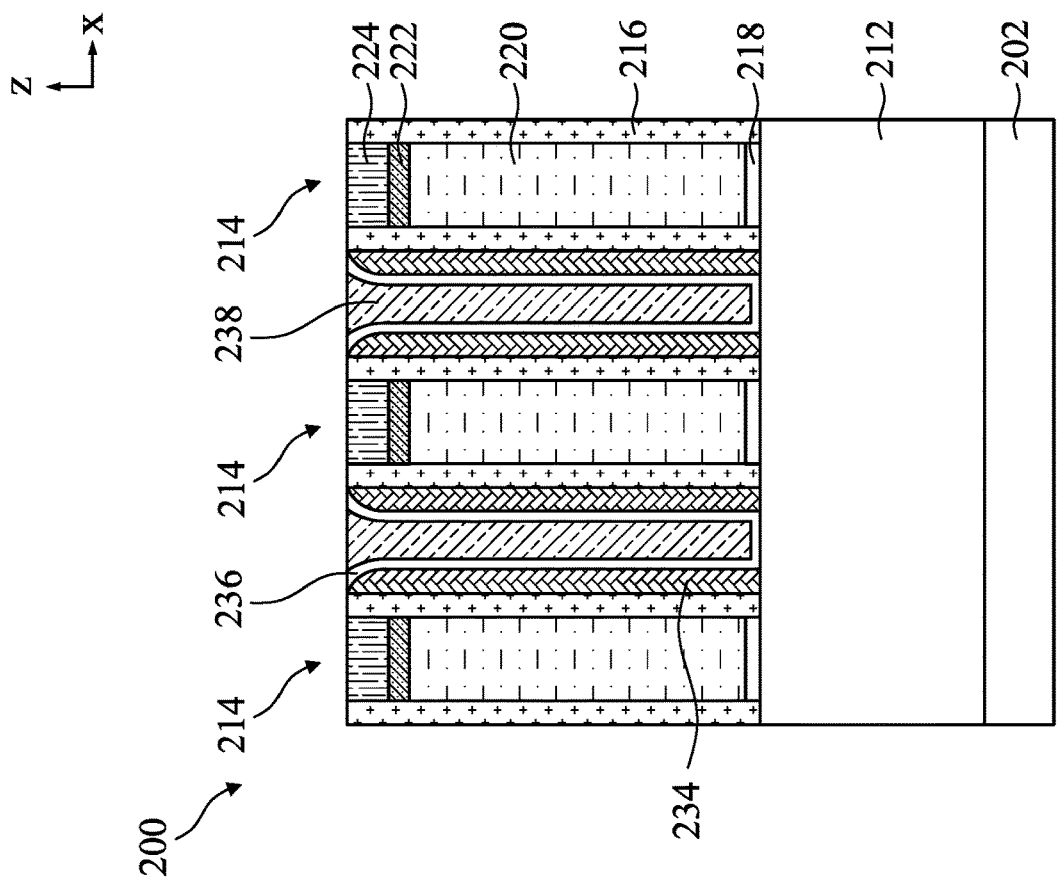
Figure 10B:
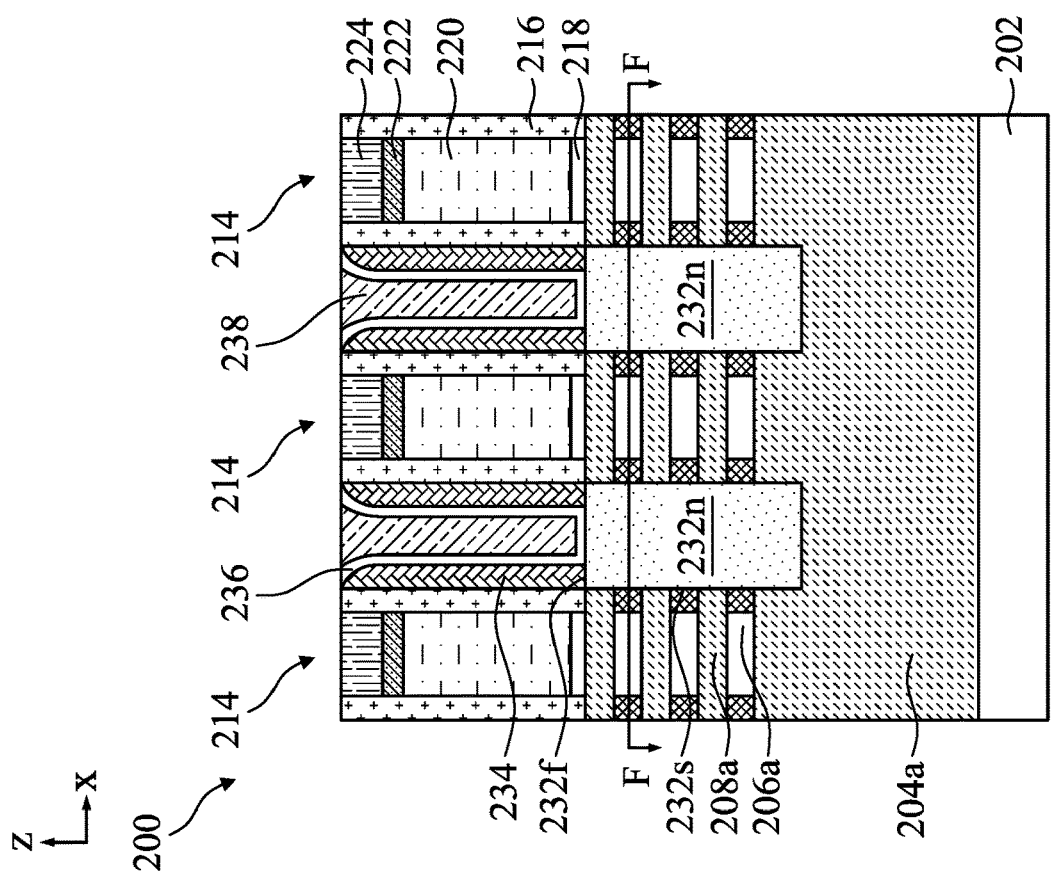
Figure 10C:
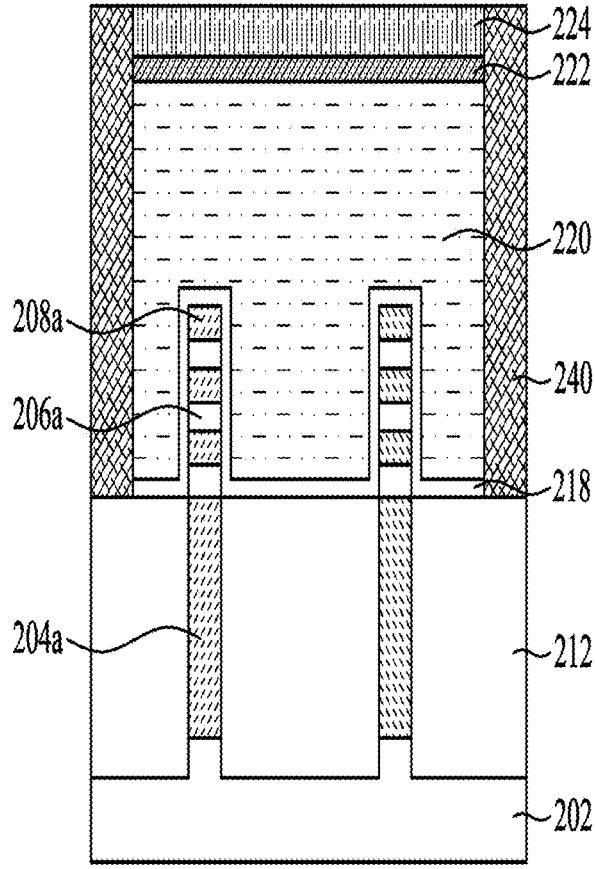
Figure 10D:
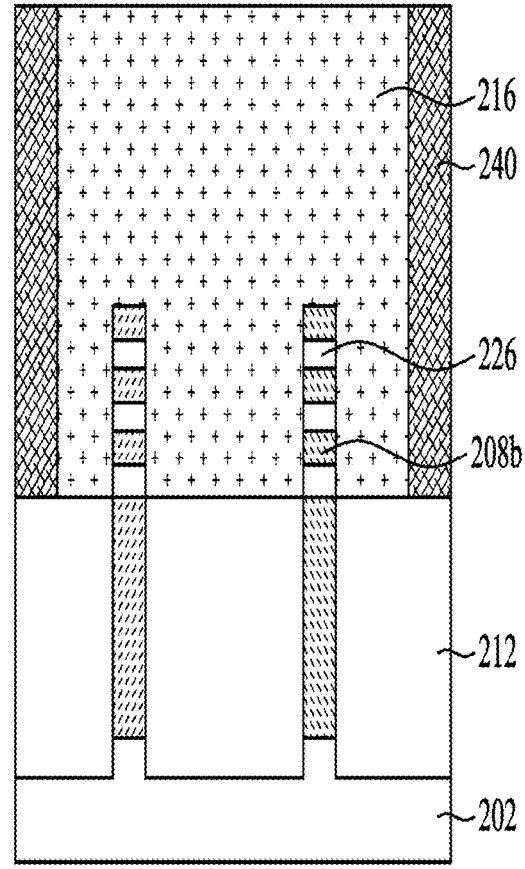
Figures 10E, 10F:
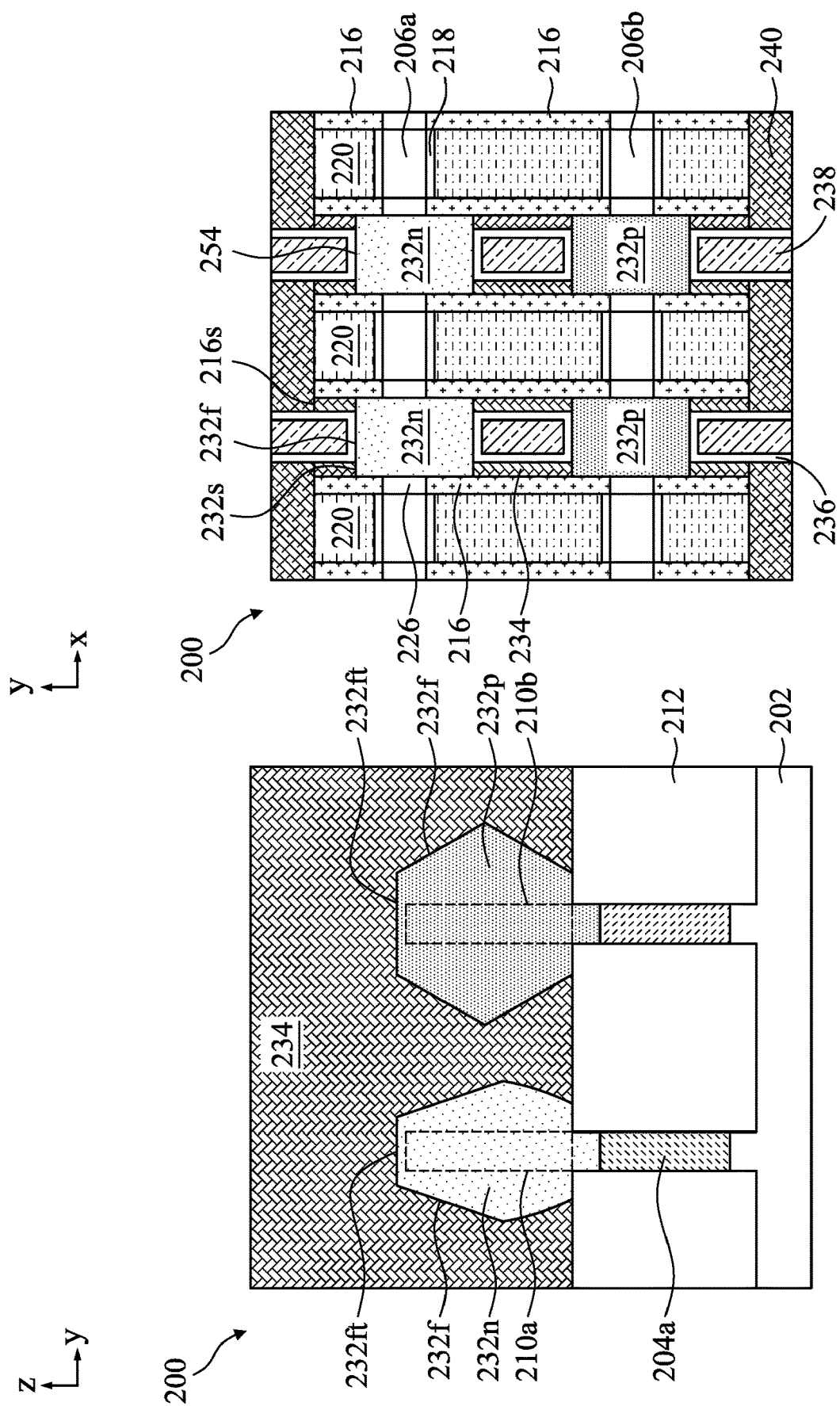

At operation 116, a contact etch stop layer (CESL) 236 and an interlayer dielectric (ILD) layer 238 are conformally formed over the semiconductor substrate, as shown in FIGS. 10A-10F. FIGS. 10A, 10B, 10C, 10D, 10E are schematic sectional views of the semiconductor device 200 along the lines A-A, B-B, C-C, D-D, E-E in FIG. 5 respectively. FIG. 10F is schematic sectional views of the semiconductor device 200 along the line F-F in FIG. 10A.

The CESL 236 may by uniformly formed over exposed surfaces of the semiconductor device 200. The CESL 236 formed on exposed facet surfaces 232f of the epitaxial source/drain features 232n, 232p, exposed surfaces of the outer sidewall spacers 234, and exposed surfaces of the isolation layer 212. The CESL 236 acts as an etch stop to provide protection to the source/drain features 232n, 232p during formation of source/drain contact features. The CESL 236 may include $Si_3N_4$, SiON, SiON or any other suitable material, and may be formed by CVD, PVD, or ALD.

The ILD layer 238 is formed over the CESL 235. The materials for the ILD layer 238 include compounds comprising Si, O, C, and/or H, such as silicon oxide, SiCOH and SiOC. Organic materials, such as polymers, may be used for the ILD layer 238. In some embodiments, the ILD layer 238 may be formed by flowable CVD (FCV). The ILD layer 238 protects the epitaxial source/drain features 232n, 232p during the removal of the sacrificial gate structures 214. A planarization process, such a CMP process, may be performed after the deposition of the material for the ILD layer 238 to expose to the sacrificial gate structures 214 for the subsequent processing.

At operation 118, optional gate end dielectric structures 240 may be formed, as shown in FIGS. 10C, 10D, and 10F. The gate end dielectric structures 240 function as isolation features to divide gate structures into individual sections as individual gates according to the circuit design. The gate end dielectric structures 240 may be formed by a lithography process to expose portions of the sacrificial gate structures 214 and portions of first and outer sidewall spacers 216, 234. One or more etch processes is followed to selectively remove the exposed sacrificial gate structures 214 and portions of first and outer sidewall spacers 216, 234. Dielectric material is then deposited to form the gate end dielectric structures 240.

In some embodiments, the gate end dielectric structures 240 may include e dielectric material selected from silicon, oxygen, carbon, nitrogen, low-k dielectric (k<3.5), other suitable material, or combinations thereof. For example, the gate end dielectric structures 240 may include silicon oxide, silicon nitride, silicon oxynitride, or silicon carbide. The gate end dielectric structures 240 may be formed by any suitable methods, such as CVD, PVD, or ALD.

Figures 11A, 11B:
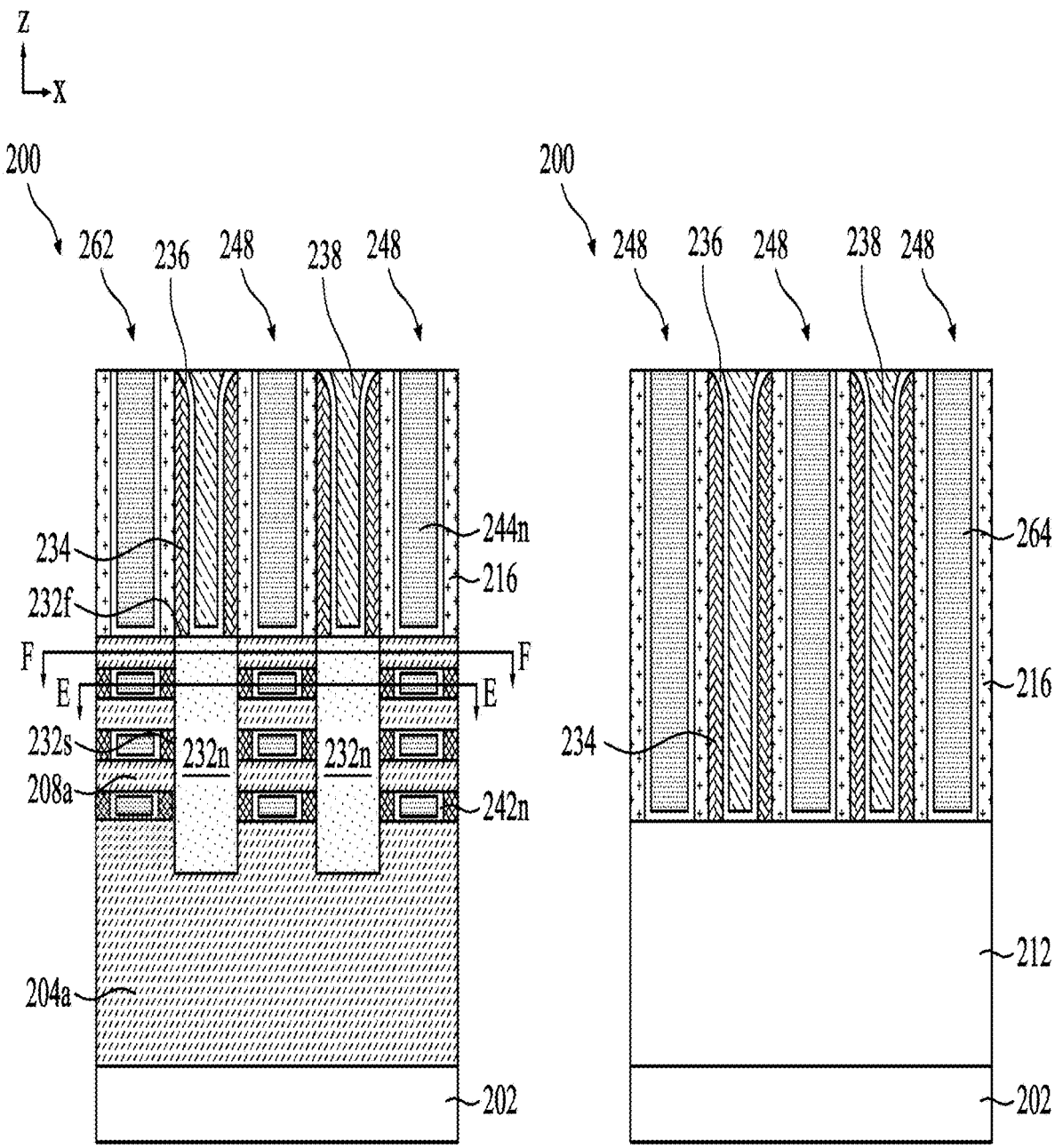
Figures 11C, 11D:
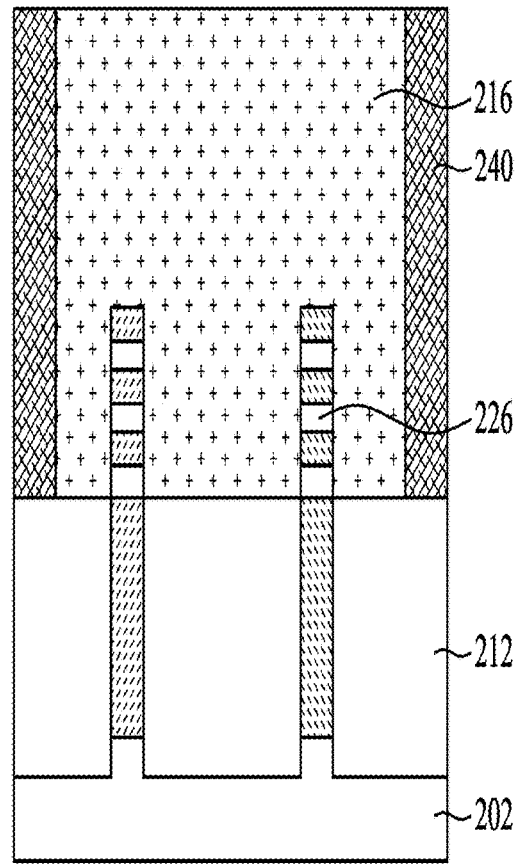
Figures 11E, 11F:
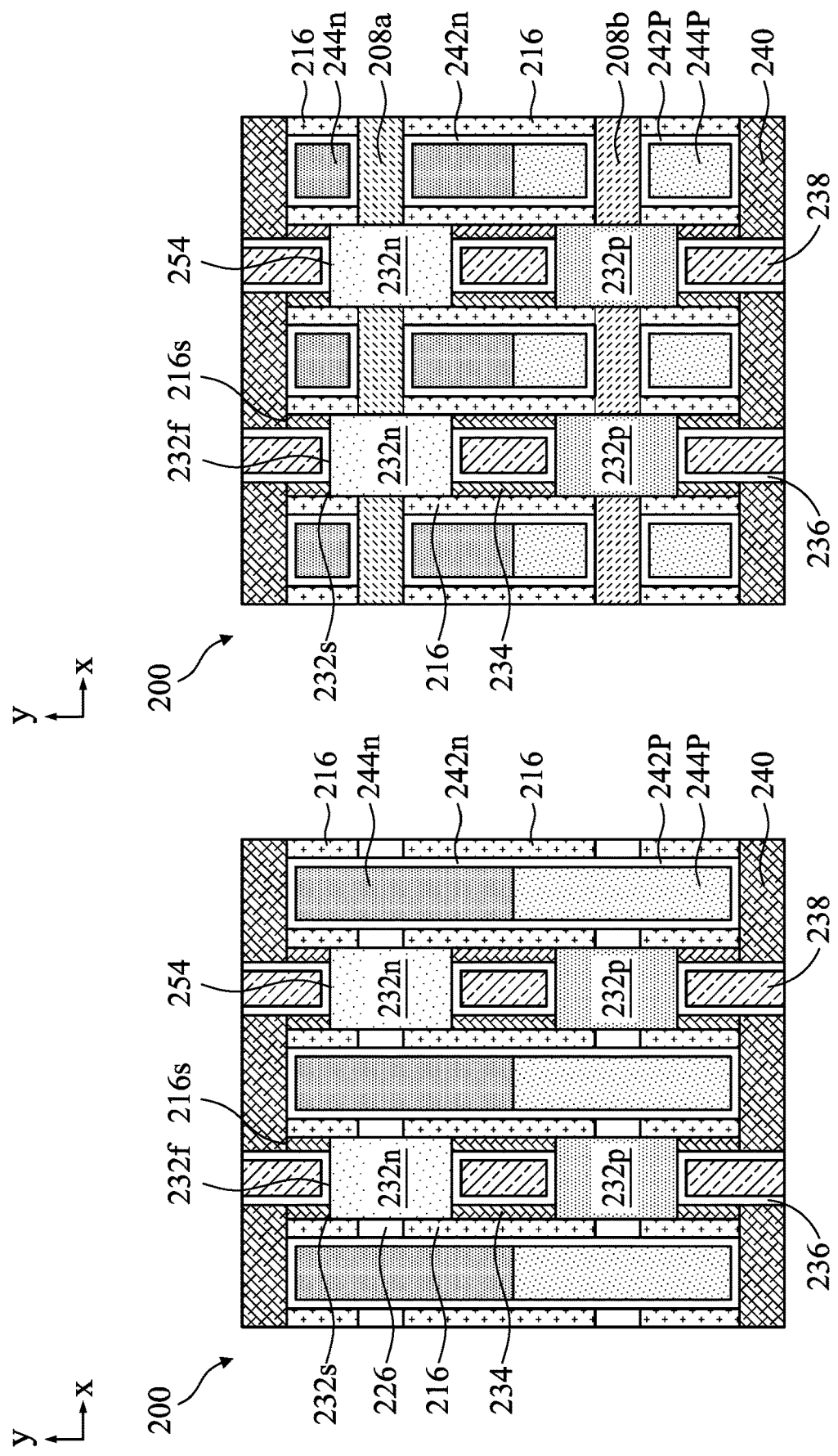

At operation 120, the sacrificial gate structures 214 are removed and replacement gate structures 248 are formed, as shown in FIGS. 11A-11F. FIGS. 11A, 11B, 11C, 11D are schematic sectional views of the semiconductor device 200 along the lines A-A, B-B, C-C, D-D in FIG. 5 respectively. FIGS. 11E and 11F are schematic sectional views of the semiconductor device 200 along the lines E-E, F-F in FIG. 11A respectively.

The sacrificial gate dielectric layer 218 and the sacrificial gate electrode layer 220 are removed using dry etching, wet etching, or a combination. The semiconductor layers 206a, 206b are exposed and subsequently removed resulting in gate cavities surrounding nanosheets of the semiconductor layers 208a, 208b. Replacement gate structures 2 are then filled in the gate cavities. The replacement gate structures 248 including a gate dielectric layer 242n, 242p and a gate electrode layer 244n, 244p for n-type devices and p-type devices respectively. In some embodiments, an interfacial layer (not shown) may be formed on the semiconductor layers 208a, 208b prior to formation of the gate dielectric layer 242n, 242p (collectively 242).

The gate dielectric layer 242n, 242p is formed on exposed surfaces in the gate cavities. The gate dielectric layer 242n, 242p may have different composition and dimensions for N-type devices and P-type devices and are formed separately using patterned mask layers and different deposition recipes. The gate dielectric layer 242n, 242p may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 242n, 242p may be formed by CVD, ALD or any suitable method.

The gate electrode layer 244n, 244p (collectively 244) is formed on the gate dielectric layer 242n, 242p to fill the gate cavities. The gate electrode layer 244n, 244p may include one or more layers of conductive material, such as tungsten, aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 244n, 244p may be formed by CVD, ALD, electro-plating, or other suitable method. In some embodiments, the gate electrode layer 244n, 244p may include different conductive materials and formed in different processes. Alternatively, the gate electrode layer 244n, 244p may include the same conductive material, and formed in the same process. After the formation of the gate electrode layer 244n, 244p, a planarization process, such as a CMP process, is performed to remove excess deposition of the gate electrode material and expose the top surface of the ILD layer 238.

Figures 12A, 12B:
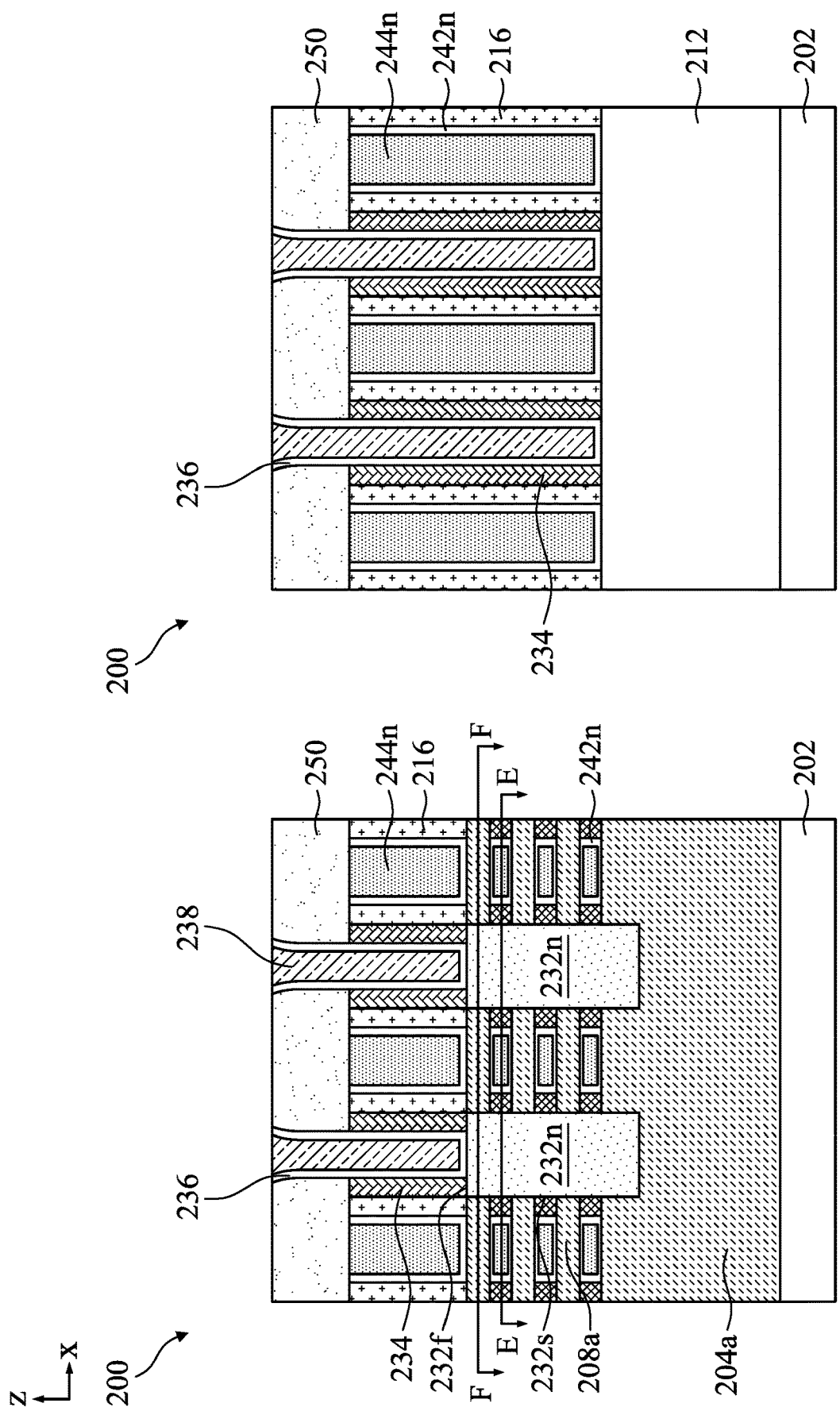
Figure 12C:
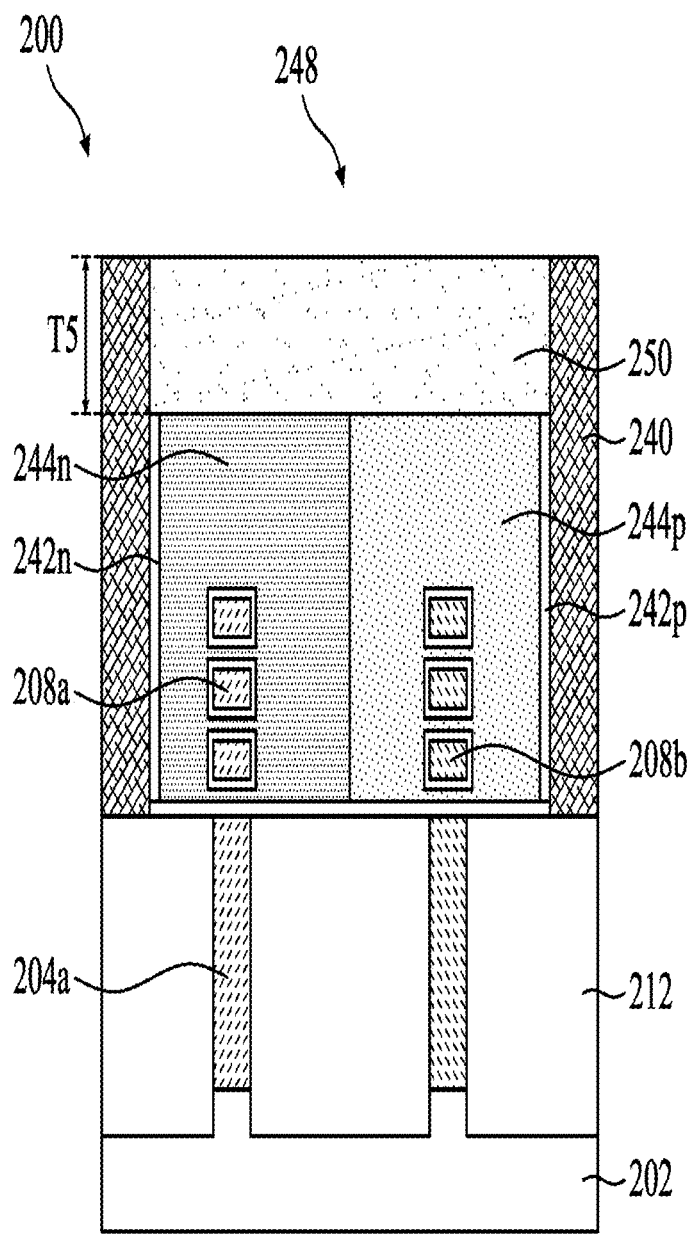

At operation 122, self-aligned contact (SAC) layer 250 is formed over the gate structure 248, as shown in FIGS. 12A-12O. FIGS. 12A, 12B, 12C are schematic sectional views of the semiconductor device 200 along the lines A-A, B-B, C-C in FIG. 5 respectively.

In some embodiments, a metal gate etching back (MGEB) process is performed to form the self-aligned contact (SAC) layer 250. One or more etching process is performed to remove portions of the gate dielectric layer 242 and the gate electrode layer 244 to form trenches in the region above the remaining gate electrode layer 244. The MGEB process may be a plasma etching process employing one or more etchants such as chlorine-containing gas, a bromine-containing gas, and/or a fluorine-containing gas. The etching process allows the gate dielectric layer 242 and the gate electrode layer 244 to be selectively etched from the ILD layer 238 and the CESL 236. In some embodiments, the inner sidewall spacers 216 and the outer sidewall spacer 234 are also etched back to a level be lower than a top surface of the CESL 236 so that the inner and outer sidewall spacers 216, 234 can be covered and protected by be subsequently formed SAC layer 250 while forming source/drain metal contacts.

In some embodiments, a metal gate liner, not shown, may be first deposited on exposed surfaces in the trenches above the gate electrode layer 244 prior to depositing the SAC layer 250. The metal gate liner and the SAC layer 250 may be formed by a suitable deposition process, such as CVD, PVD, or ALD. The metal gate liner may function as a diffusion barrier for the gate electrode layer 244. The metal gate liner may be a dielectric layer including but not limited to SiO, SiN, SiC, SiCN, SiOC, SiON, SiOCN, ZrO, ZrN, or a combination thereof. The SAC layer 250 may be any dielectric layer that can be used as an etch stop layer during subsequent trench and via patterning for metal contacts. In some embodiments, the SAC layer 250 may a high-k dielectric layer. The SAC layer 250 may a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiON, or any combinations thereof.

After filling the trenches with the SAC layer 250, a planarization process, such as a CMP process, is performed to remove excess deposition of the SAC layer 250 and metal gate liner to expose the top surface of the ILD layer 238. In some embodiments, the SAC layer 250 has a thickness T5 along the z-direction. In some embodiments, the thickness T5 may be in a range between about 3 nm and 30 nm.

Figures 13A, 13B:
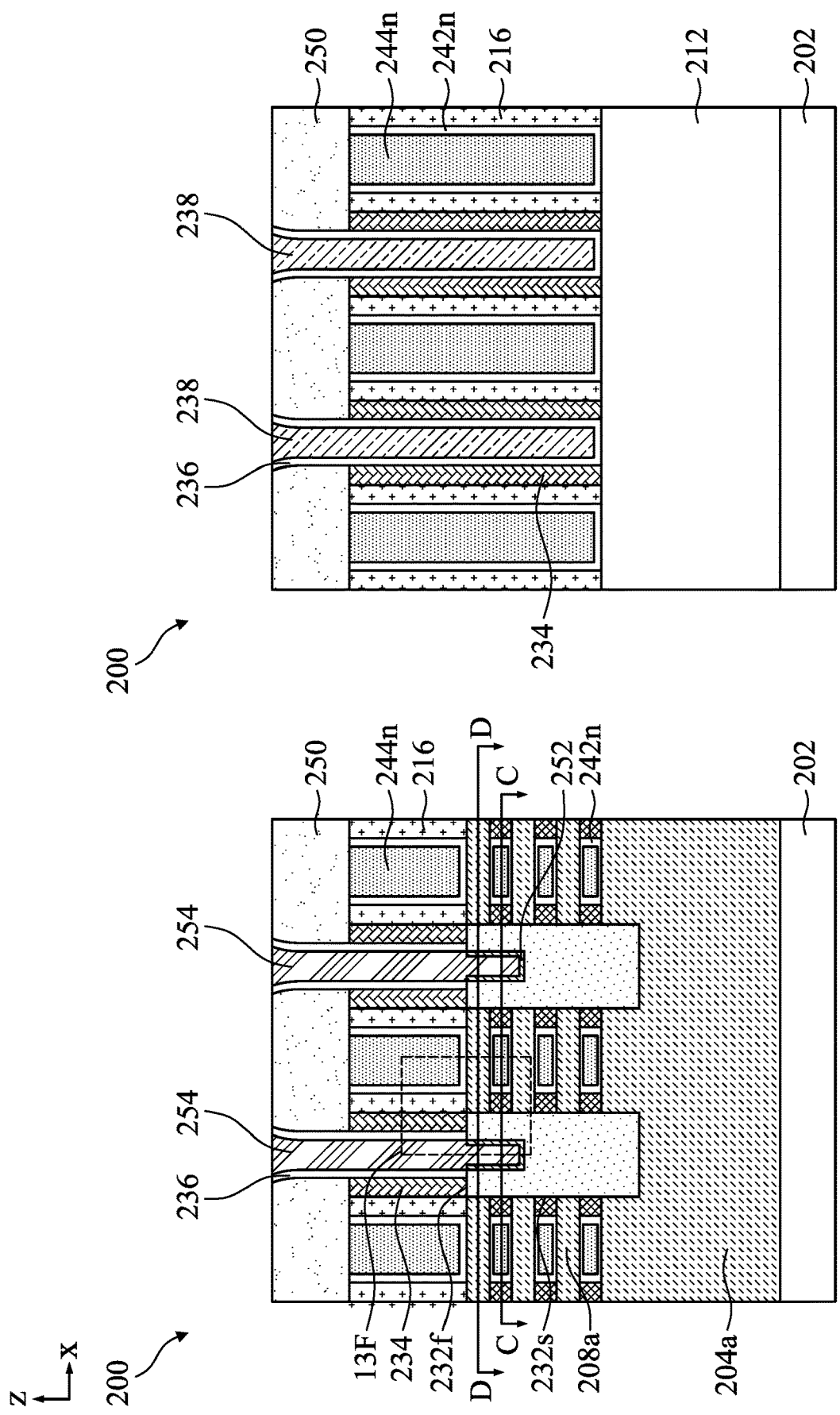
Figures 13C, 13D:
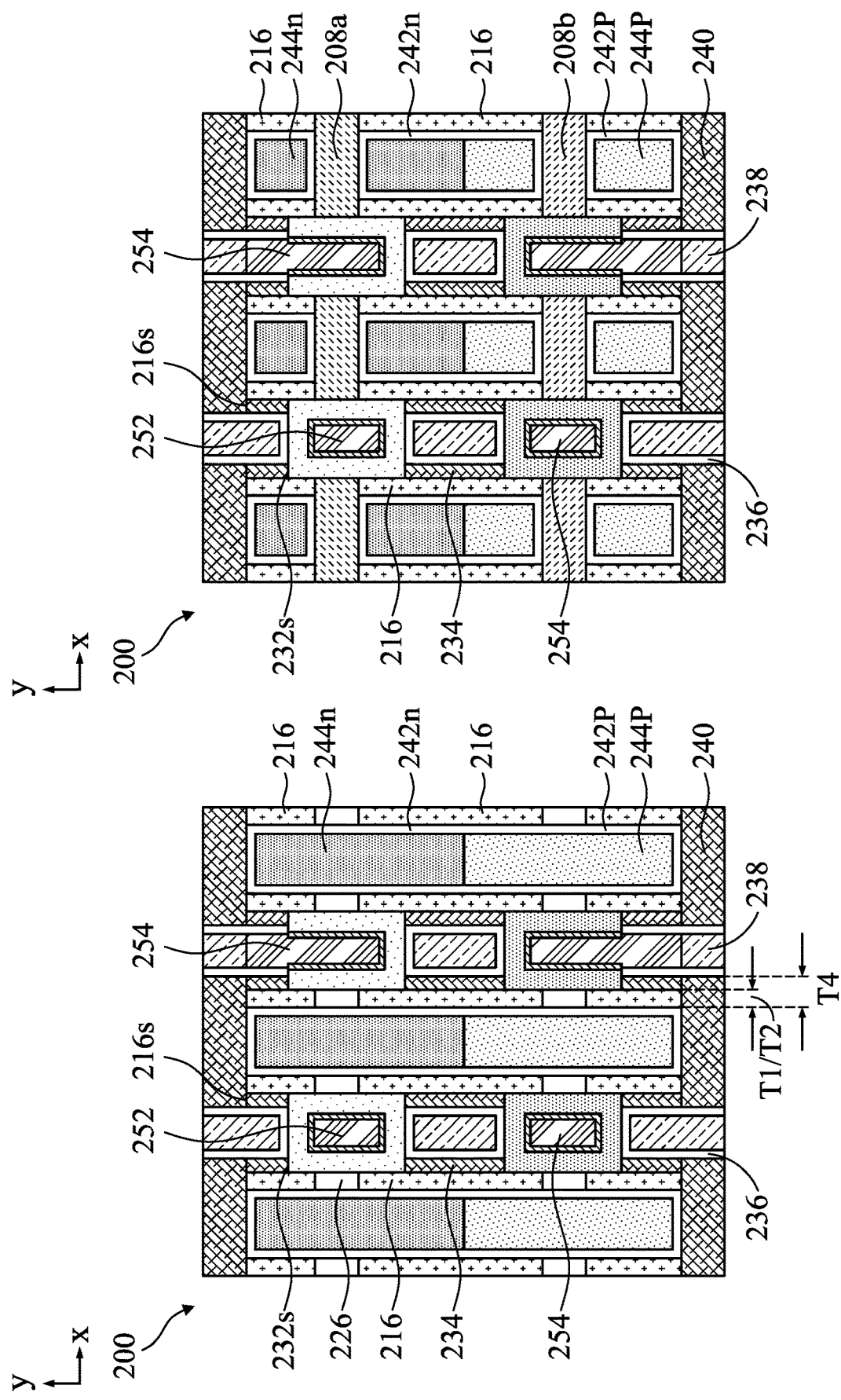
Figure 13F:
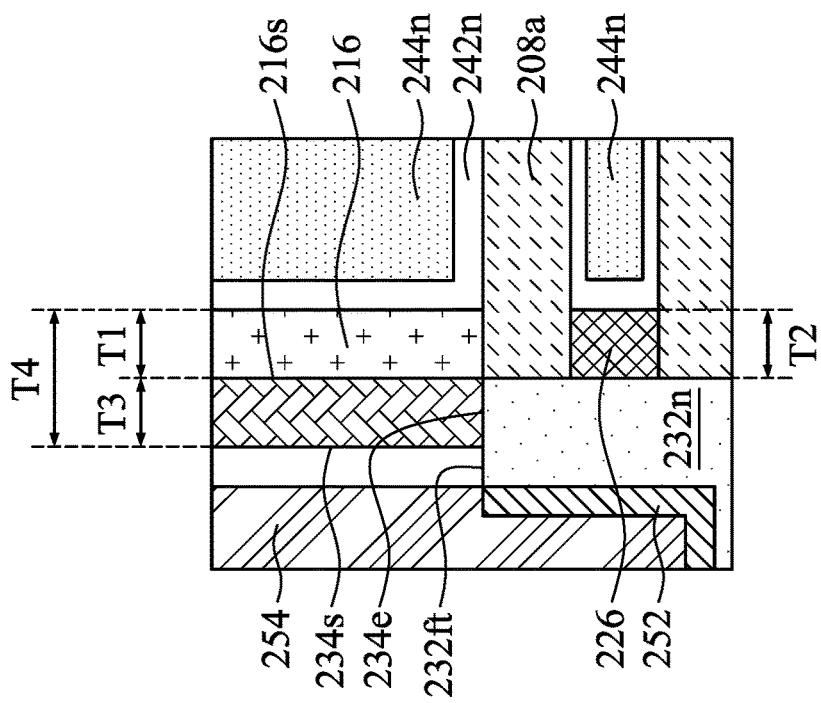
Figure 13E:
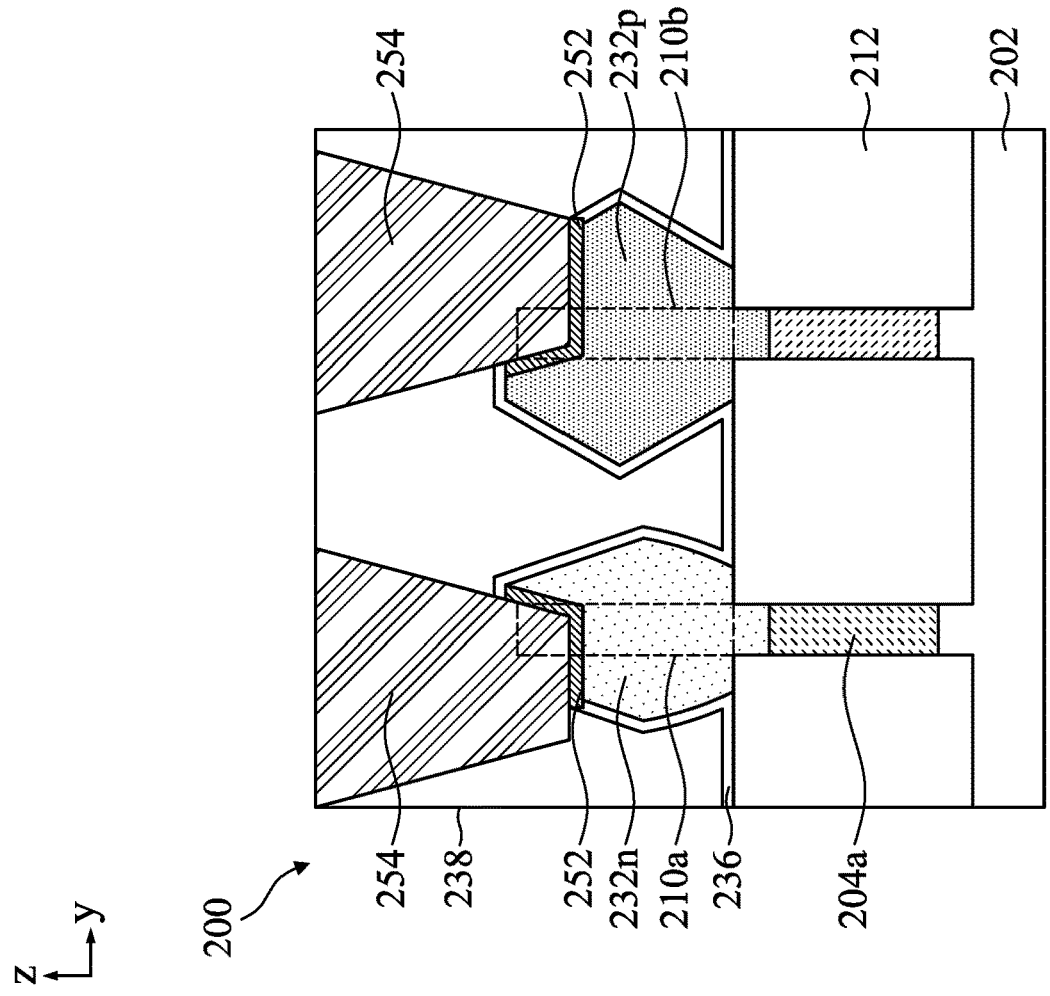

At operation 124, source/drain contact features 254 are formed as shown in FIGS. 13A-13F. FIGS. 13A, 13B, 13E are schematic sectional views of the semiconductor device 200 along the lines A-A, B-B, E-E in FIG. 5 respectively. FIGS. 13C, 13D are schematic sectional views of the semiconductor device 200 along the lines C-C, D-D in FIG. 13A respectively. FIG. 13F is a schematic partial enlarged view of the semiconductor device in an area 13F marked in FIG. 13A.

Contact holes may be formed through the ILD layer 238 and the CESL 236 to expose the epitaxial source/drain features 232n, 232p, and subsequently filled with a conductive material. Suitable photolithographic and etching techniques are used to form the contact holes through various layers. After the formation of the contact holes, a silicide layer 252 is selectively formed over surfaces of the epitaxial source/drain features 232n, 232p exposed by the contact holes. The silicide layer 252 may be formed by depositing a metal source layer to cover exposed surfaces including the exposed surfaces of the epitaxial source drain features 232n, 232p and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed. During the rapid anneal process, the portion of the metal source layer over the epitaxial source/drain features 232n, 232p reacts with silicon in the epitaxial source/drain features 232n, 232p to form the silicide layer 252. Unreacted portion of the metal source layer is then removed. In some embodiments, the silicide layer 253 may include one or more of WSi, CoSi, NiSi, TiSi, MoSi, and TaSi.

After formation of the silicide layer 252, a conductive material is deposited to fill contact holes and form the source/drain contact features 254. Optionally, a barrier layer, not shown, may be formed in the contact holes prior to forming the source/drain contact features 254. In some embodiments, the conductive material layer for the gate contact may be formed by CVD, PVD, plating, ALD, or other suitable technique. In some embodiments, the conductive material for the source/drain contact features 254 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 238.

As shown in FIGS. 13A and 13F, spacers disposed between the gate electrode layer 244n, 244p and the source/drain features 232n, 232p include the inner spacers 226 or the inner sidewall spacers 216. The thickness of the spacers disposed between the gate electrode layer 244n, 244p and the source/drain features 232n, 232p is the thickness T1 or the thickness T2. Spacers disposed between the gate electrode layer 244n, 244p and the source/drain contact features 254 include the inner sidewall spacers 216 and the outer sidewall spacer 234. The thickness of the spacers disposed between the gate electrode layer 244n, 244p and the source/drain contact features 254 is the thickness T4, which is summation of the thickness T1 and the thickness T3, The thinner spacers between the gate electrode layer 244n, 244p and the source/drain features 232n, 232p provide increased volume of the source/drain features 232n, 232p, which lowers ion resistance and improves device performance. The thicker spacers between the gate electrode layer 244n, 244p and the source/drain contact features 254 reduce capacitance therebetween and increase the breakdown voltage.

Figures 14A, 14B:
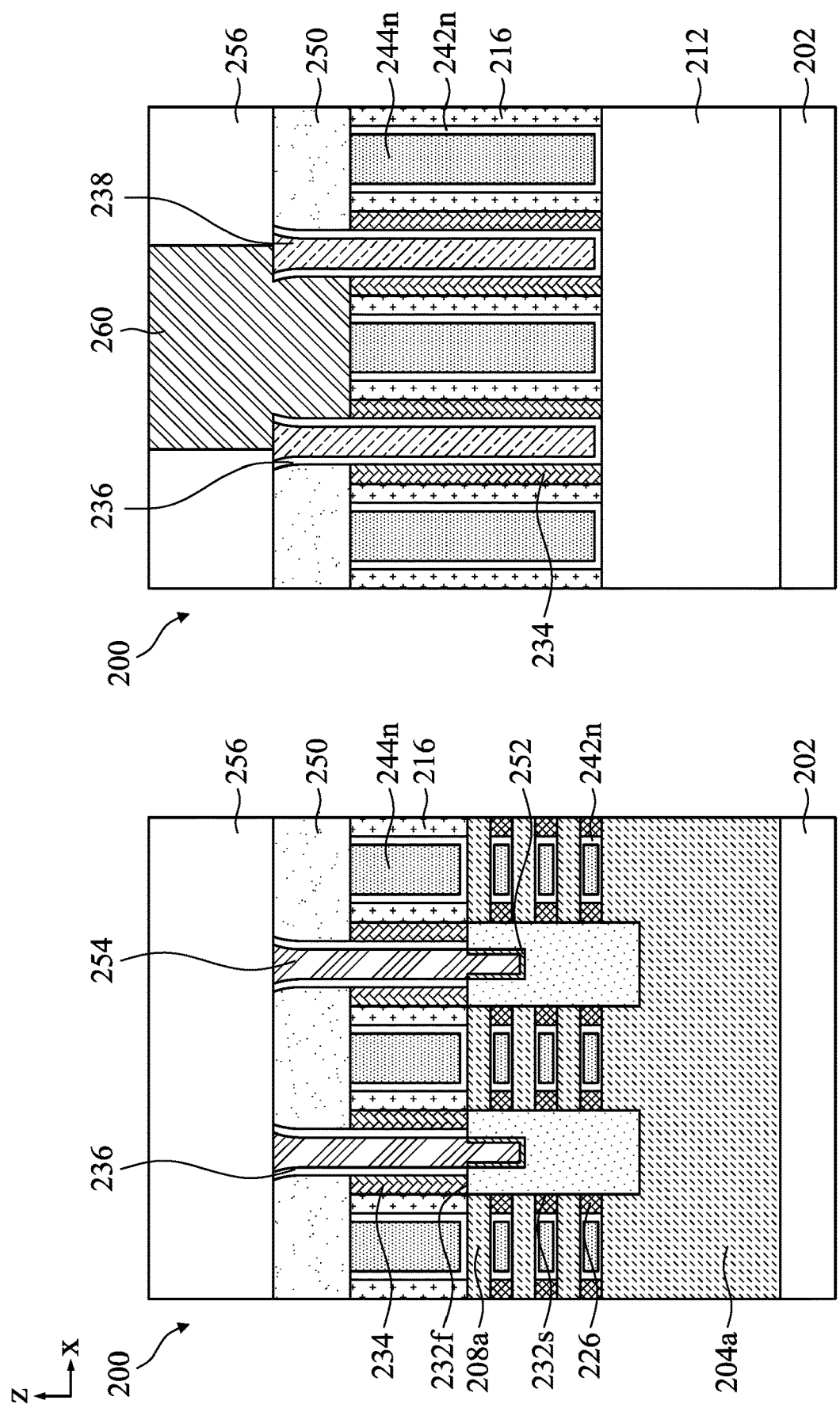
Figures 14C, 14D:
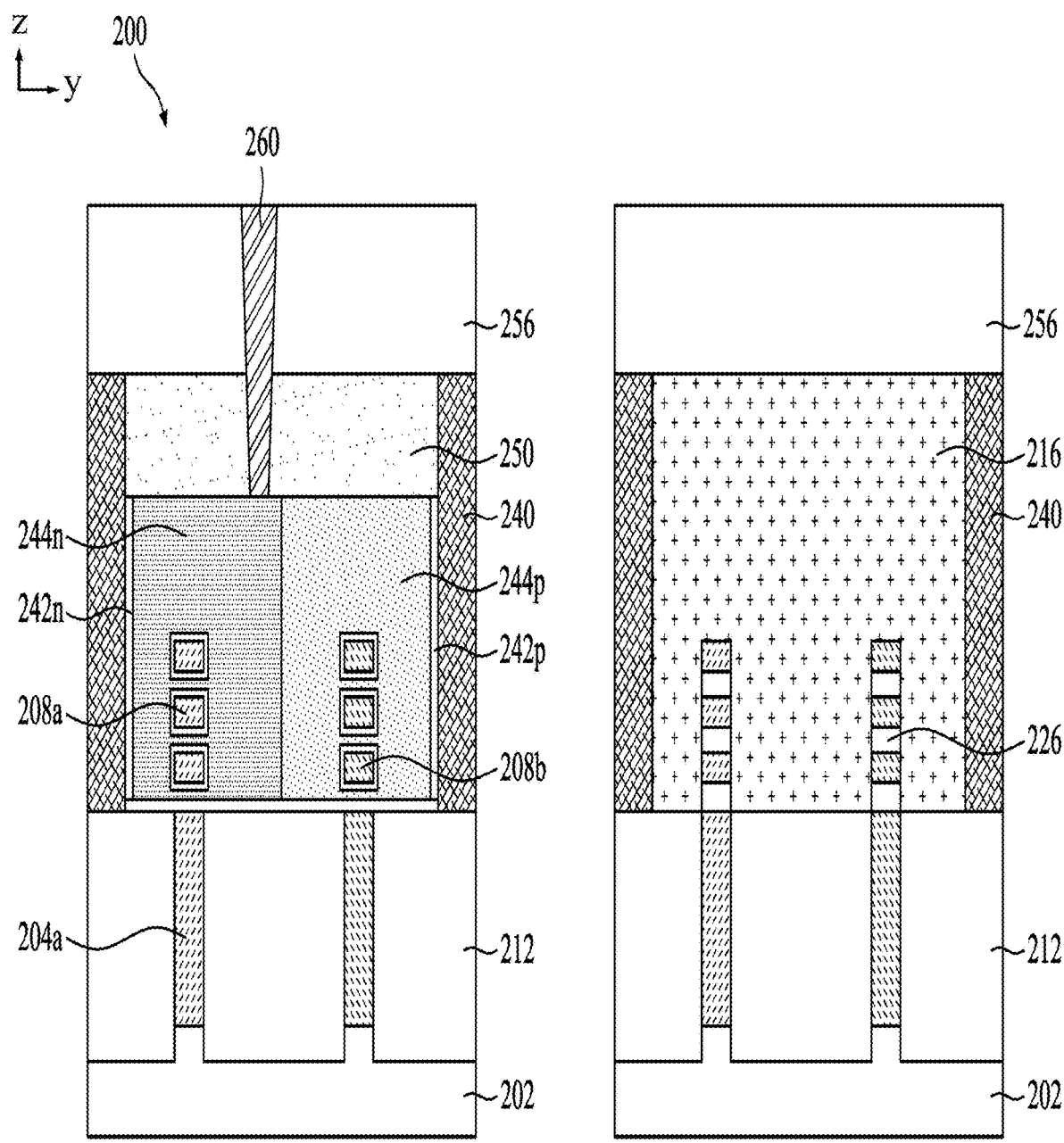

At operation 126, a dielectric layer 256 is deposited on the ILD layer 238 and contact vias 258 to the source/drain contact features 254 and gate contacts 260 to the gate electrode layer 244, as shown in FIGS. 14A-14F, FIGS. 14A, 14B, 14C, 14D, 14E are schematic sectional views of the semiconductor device 200 along the lines A-A, B-B, C-C, D-D, E-E in FIG. 5 respectively. FIG. 14F is a schematic plan view of the semiconductor device 200. FIG. 14F schematically illustrates relative location of the gate contacts 260 and the contact vias 258 in the semiconductive device 200. The lines A-A, B-B, C-C, D-D, E-E in FIG. 14F correspond to the lines A-A, B-B, C-C, D-D, E-E in FIG. 5 and indicate locations of the cross sections shown in FIGS. 14A, 14B, 14C, 14D, 14E.

The ILD layer 256 may be referred to as intermetal dielectric (IMD) layer to provide conductive routings to the semiconductor device 200. In some embodiments, the ILD layer 256 may include a low-k dielectric material, such as compounds comprising Si, O, C, and/or H, such as silicon oxide, SiCOH and SiOC. Organic materials, such as polymers, may be used for the ILD layer 256.

Suitable photolithographic and etching techniques are used to form the contact openings, such as trenches and vies, through the ILD layer 256 to expose the source/drain contact features 254 and portions of the SAC layer 250. The exposed SAC layer 250 may be removed by suitable methods to expose the gate electrode layer 244 below. After the formation of the contact openings, a conductive material is deposited to fill contact openings and form the source/drain contact vies 258 and gate contacts 260. Optionally, a barrier layer, not shown, may be formed in the contact openings prior to filling the conductive material. In some embodiments, the conductive material layer for the gate contacts 260 and the source/drain contact vias 258 may be formed by CVD, PVD, plating, ALD, or other suitable technique. In some embodiments, the conductive material for the source/drain contact vies 258 may include TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 256, on which subsequent layers, such as IMD layers, may be formed.

Figures 15A, 15B:
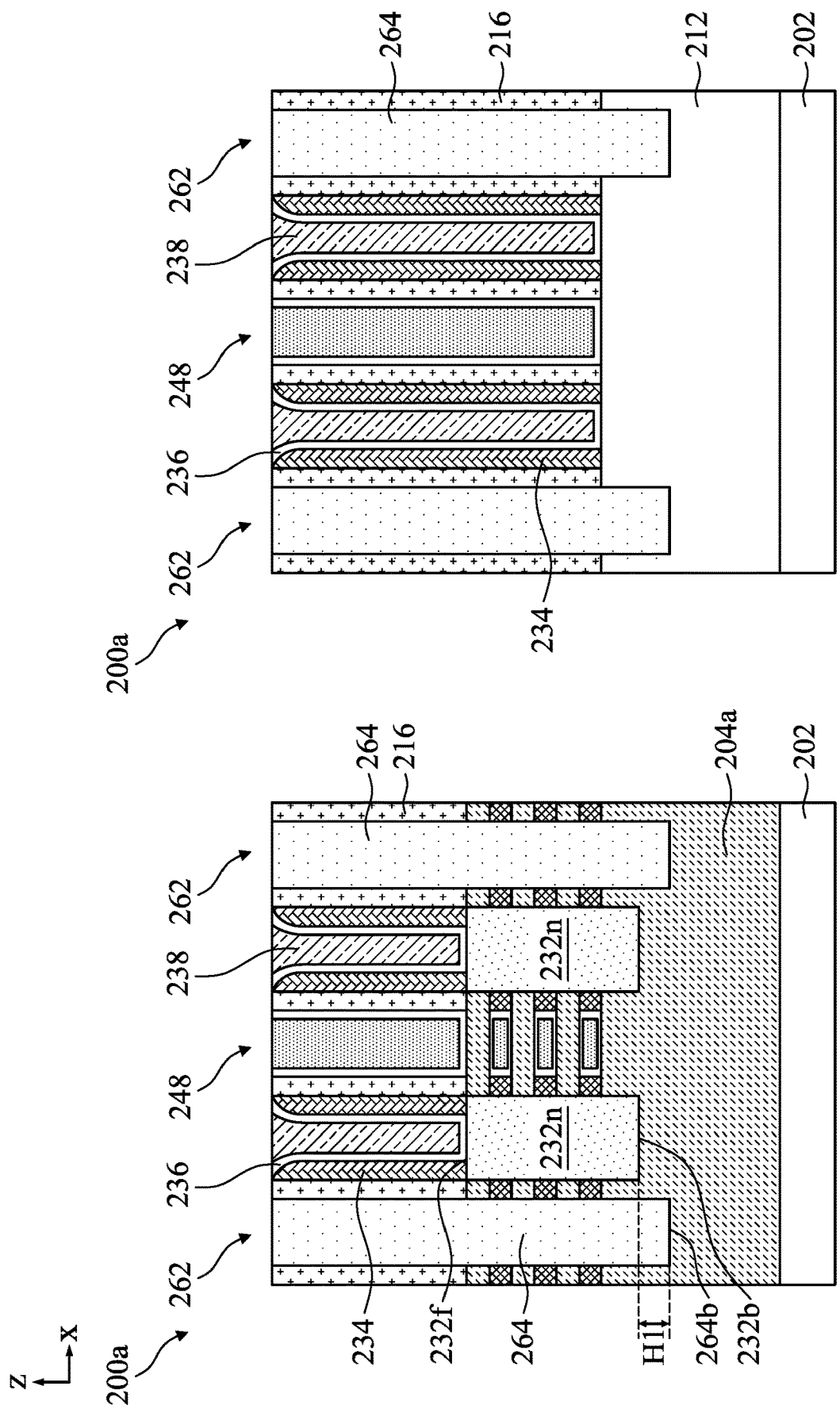

FIGS. 15A-15B, and 16A-16H schematically illustrate a semiconductor device 200a according to another embodiment of the present disclosure. The semiconductor device 200a is similar to the semiconductor device 200 except that semiconductor device 200a includes dielectric gate structures 262 formed between different device cells. The semiconductor device 200a may be fabricated according using the method 100 described above until operation 118, resulting in a semiconductor structure as shown in FIGS. 10A-10F. FIGS. 15A-15B schematically illustrate the semiconductor device 200b after operation 120 in which the dielectric date structures 262 are formed. FIGS. 15A, 15B are schematic sectional views of the semiconductor device 200b along the lines A-A, B-B in FIG. 5 respectively.

During operation 120, in which the replacement gate structures 248 are formed, selected the sacrificial gate structures 214 and the fin structures 210a, 210b under the selected gate structures 214 are removed to form trenches between the inner sidewall spacers 216. A dielectric material 264 is then filled in the trenches to form the dielectric gate structure 262. In some embodiments, the trenches for the dielectric gate structures 262 is formed at a level below a bottom surface 232b of the source/drain features 232n, 232p to effectively isolate the source/drain features of neighboring cells. In some embodiments, the dielectric material 264 may include one or more layers of dielectric materials. In some embodiments, the dielectric material 264 include silicon oxide, silicon nitride, silicon oxynitride, FSG, a low-k dielectric, combinations thereof. The dielectric material 264 may be formed by HDP-CVD, FCVD, or other suitable deposition process.

In some embodiments, a bottom surface 264b of the dielectric material 264 may be at a distance H1 below the bottom surface 232b of the source/drain features 232n, 232p. In some embodiments, the distance H1 is in a range between about 10 nm and about 100 nm. A distance less than 10 nm would not be deep enough to isolating the well regions on opposite sides of the dielectric gate structure 262. A distance greater than 100 nm would increase operation cost without additional benefit and impact to well resistance.

Figures 16A, 16B:
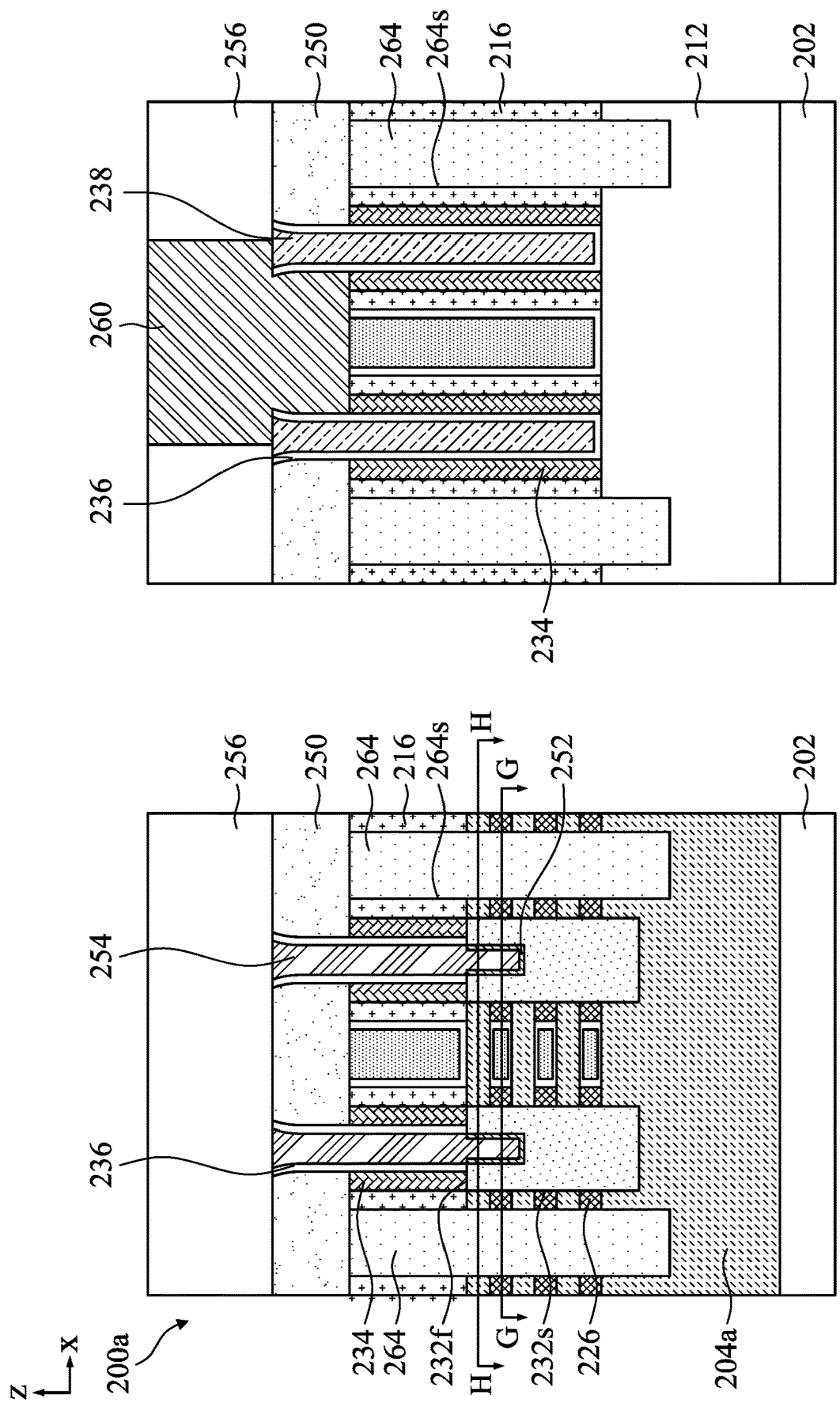
Figures 16C, 16D:
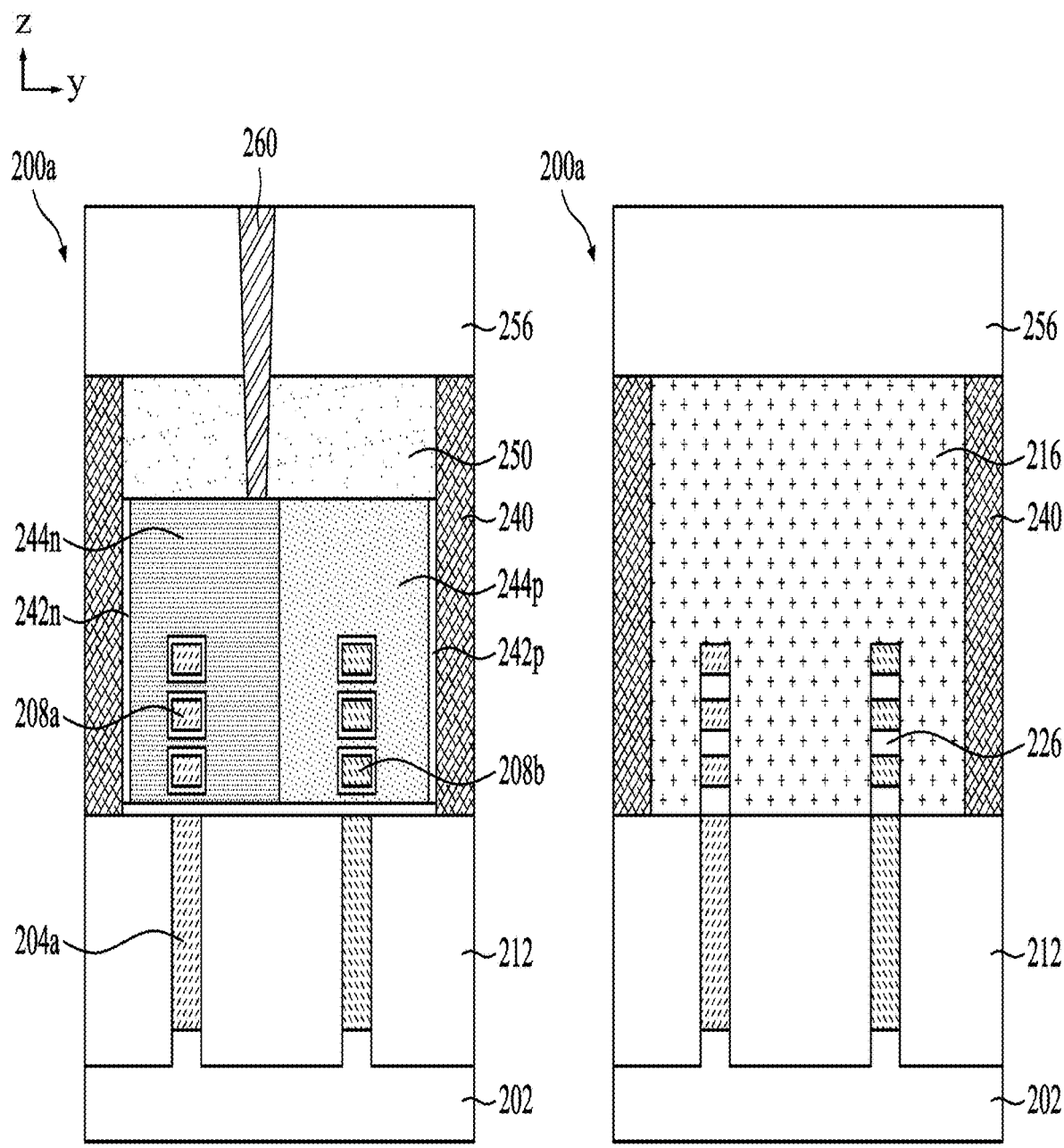
Figures 16E, 16F:
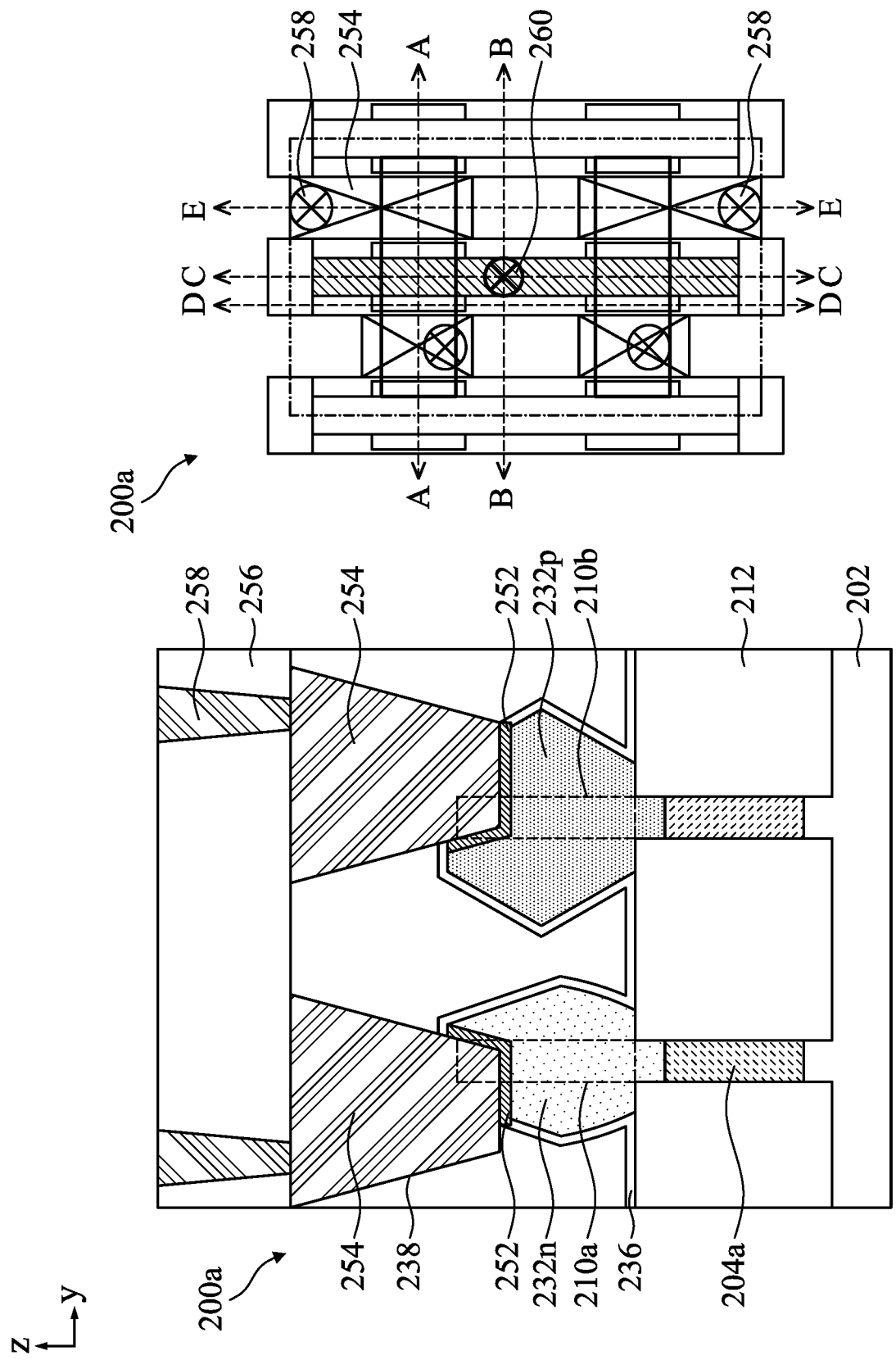

After formation of the dielectric gate structures 262 and replacement gate structures, operations 122 to 126 of the method 100 may be subsequently performed to produce the semiconductor device 200a as shown in FIGS. 16A-16F. FIGS. 16A, 16B, 16C, 16D, 16E are schematic sectional views of the semiconductor device 200a along the lines A-A, B-B, C-C, D-D, E-E in FIG. 5 respectively. FIG. 16F is a schematic layout view of the semiconductive device 200a.

The lines A-A, B-B, C-C, D-D, E-E in FIG. 16F correspond to the lines A-A, B-B, C-C, D-D, E-E in FIG. 5 and indicate locations of the cross sections shown in FIGS. 16A, 16B, 160, 16D, 16E. FIGS. 16G-16H are schematic sectional views of the semiconductor device 200a along the lines G-G, H-H in FIG. 16A respectively.

As shown in FIGS. 16A, 16B, 16G, 16H, the inner spacers 226, the inner sidewall spacers 216, and the outer sidewall spacers 234 are disposed against a sidewall 264s of the dielectric material 264 of the dielectric gate structure 262. Spacers disposed between the dielectric gate structures 262 and the source/drain contact features 254 include the inner sidewall spacers 216 and the outer sidewall spacer 234. The thickness of the spacers disposed on other portions of the dielectric gate structures 262 is the thickness T4, which is summation of the thickness T1 and the thickness T3. The thinner spacers between the dielectric gate structures 262 and the source/drain features 232n, 232p provide increased volume of the source/drain features 232n, 232p, which lowers ion resistance and improves device performance.

Figure 17:
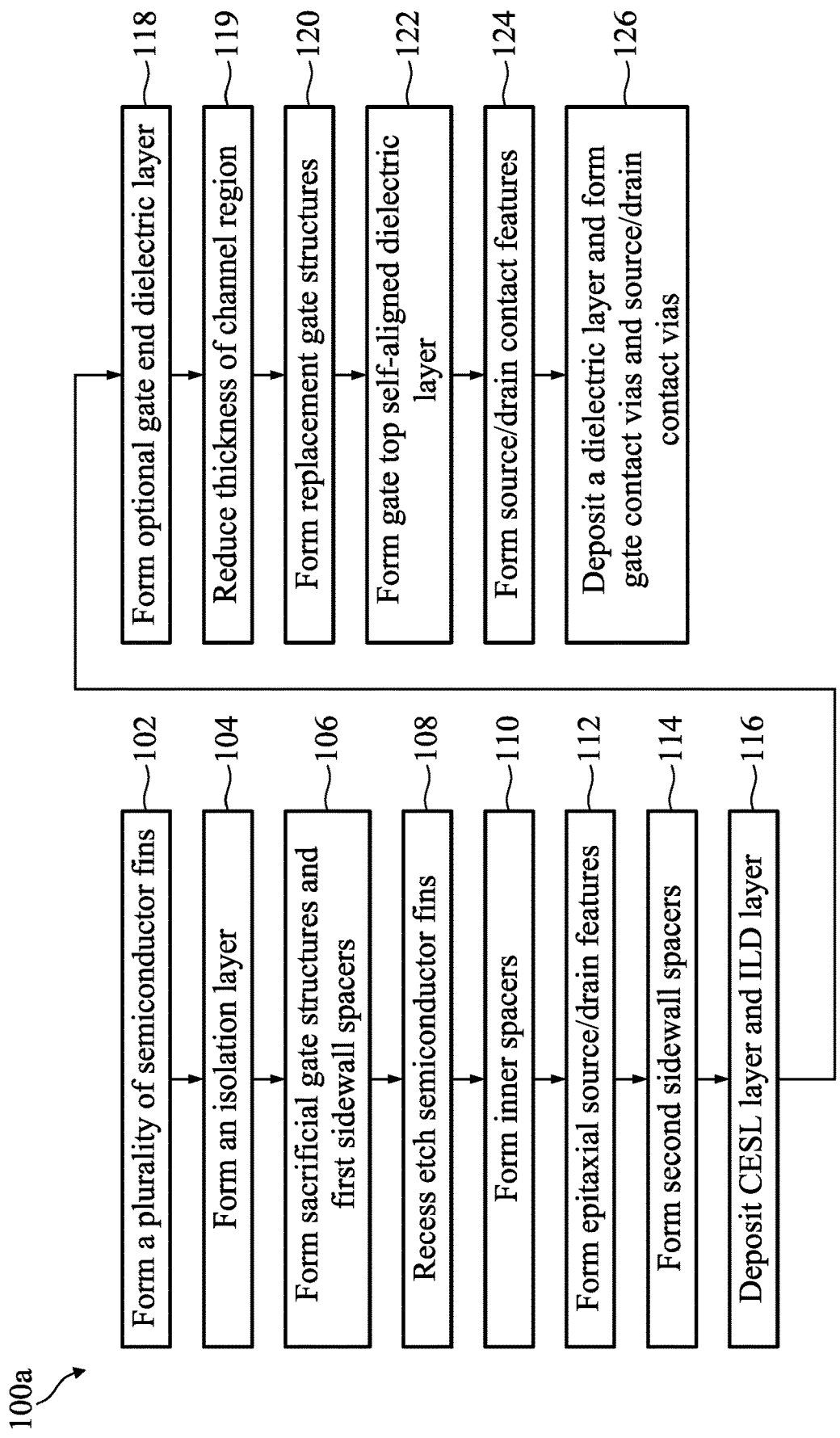
FIG. 17 is a flow chart of a method for manufacturing of a semiconductor device according to embodiments of the present disclosure.

FIG. 17 is a flow chart of a method 100a for manufacturing of a semiconductor device according to embodiments of the present disclosure. The method 100a is similar to the method 100 of FIG. 1 except that the method 100a includes an operation 119 to reduce thickness of channel regions. The operation 119 may be performed before formation of replacement gate structures. FIGS. 18A-18F and FIGS. 19A-H schematically illustrate various stages of semiconductor device 200b fabricated according to the method 100a. The semiconductor device 200b may be fabricated according using the method 100 described above until operation 118, resulting in a semiconductor structure as shown in FIGS. 10A-10F.

FIGS. 18A-18F schematically illustrate the semiconductor device 200b after operation 119, in which the thickness of the channel regions is reduced. FIGS. 15A, 15B are schematic sectional views of the semiconductor device 200b along the lines A-A, B-B in FIG. 5 respectively.

FIGS. 18A, 18B, 180, 18D are schematic sectional views of the semiconductor device 200 along the lines A-A, B-B, C-C, D-D in FIG. 5 respectively. FIGS. 18E and 18F are schematic sectional views of the semiconductor device 200b along the lines E-E, F-F in FIG. 18A respectively. At operation 119, the sacrificial gate dielectric layer 218 and the sacrificial gate electrode layer 220 are first removed using dry etching, wet etching, or a combination. The semiconductor layers 206a, 206b are exposed and subsequently removed resulting in gate cavities surrounding nanosheets of the semiconductor layers 208a, 208b.

According to embodiments of the present disclosure, a suitable etching process, such as a dry etch, wet etch, or a combination, is performed to reduce the thickness of the semiconductor layers 208a, 208b. In some embodiments, a plasma etch with an etchant comprising tetrafluoromethane ($CF_4$), sulfur hexafluoride ($SF_6$), nitrogen trifluoride ($NF_3$), chlorine gas ($Cl_2$), or fluorine ($F_2$). In some embodiments, a reactive ion etching process using $CF_4$, $SF_6$ and $BCl_2$, and $Cl_2$ is performed. In other embodiments, a wet etching process using potassium hydroxide (KOH), ethylenediamine pyrocatechol (EDP), tetramethylammonium hydroxide (TMAH), or similar, may be used.

Figures 18C, 18D:
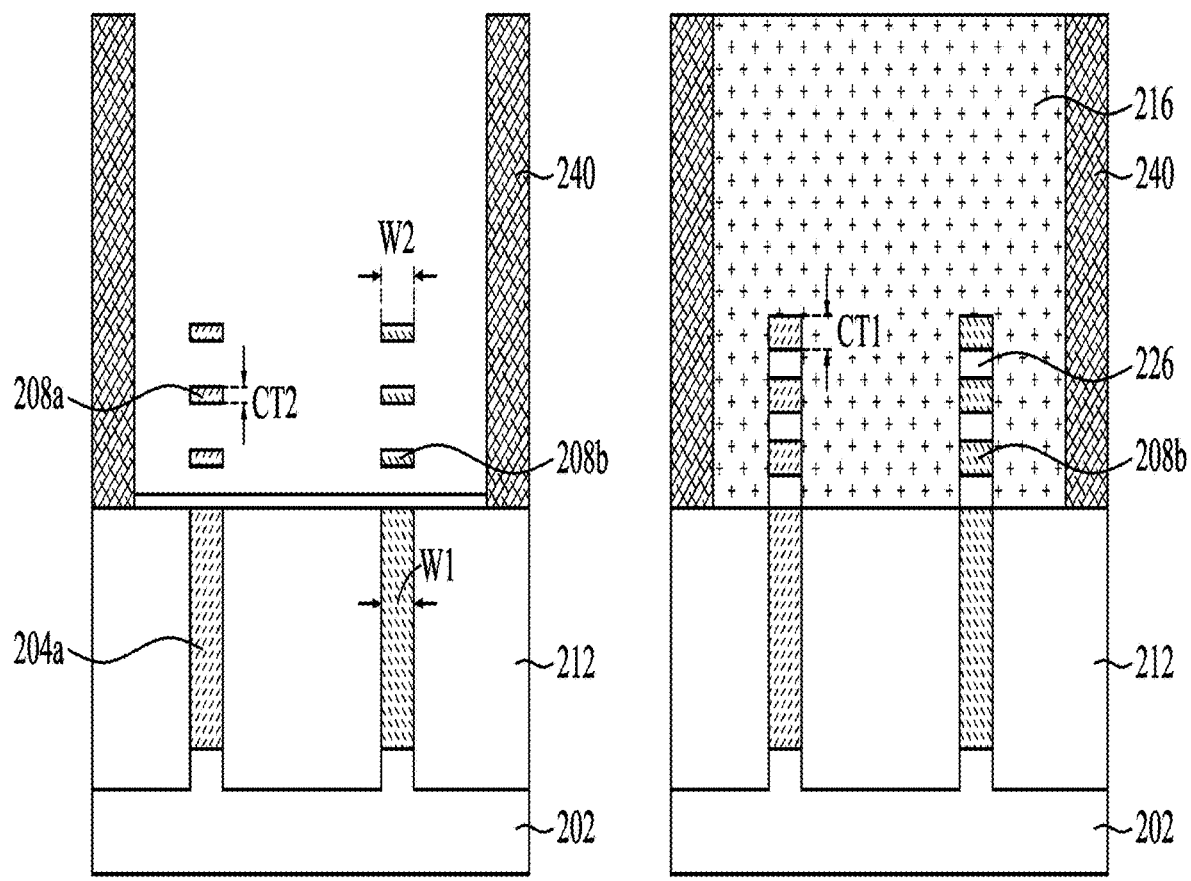

As shown in FIGS. 18A, 18C, and 18F, portions of the semiconductor layers 208a, 208b exposed in the gate regions are etched to from the original thickness CT1 to a reduced thickness CT2 along the z-direction. By reducing the thickness of the channel region, the Drain-induced barrier lowering (DIBL) or short-channel effect in resulting device can be reduced. The difference between CT1 and CT1 may be in a range between 0.5 nm and 3 nm. A thickness difference lower than 0.5 nm would not provide enough benefit to justify the operation cost, a thickness difference greater than 3 nm may affect structural integrity of the nanosheet channels without added benefit. In some embodiments, a ratio of the thickness CT1 over the thickness CT2 may be in a range between 1.1 and 2.0. A ratio lower than 1.1 would not provide enough benefit to justify the operation cost, a ratio greater than 2 may affect structural integrity of the nanosheet channels without added benefit.

In some embodiments, the semiconductor layers 208a, 208b in the gate regions also have reduced dimension along the y-direction, as a result of the etching process. As shown in FIG. 18F, after the etch process, the semiconductor layers 208a, 208b in the gate regions have a width W2, reduced from the original width W1. In some embodiments, the difference between the width W1 and the width W2 is between 0.1 nm and 3 nm. In some embodiments, the etching process parameter or process gas may be tuned to perform an anisotropic etching, the width of the semiconductor layers 208a, 208b maintains substantially the same.

Figures 19A, 19B:
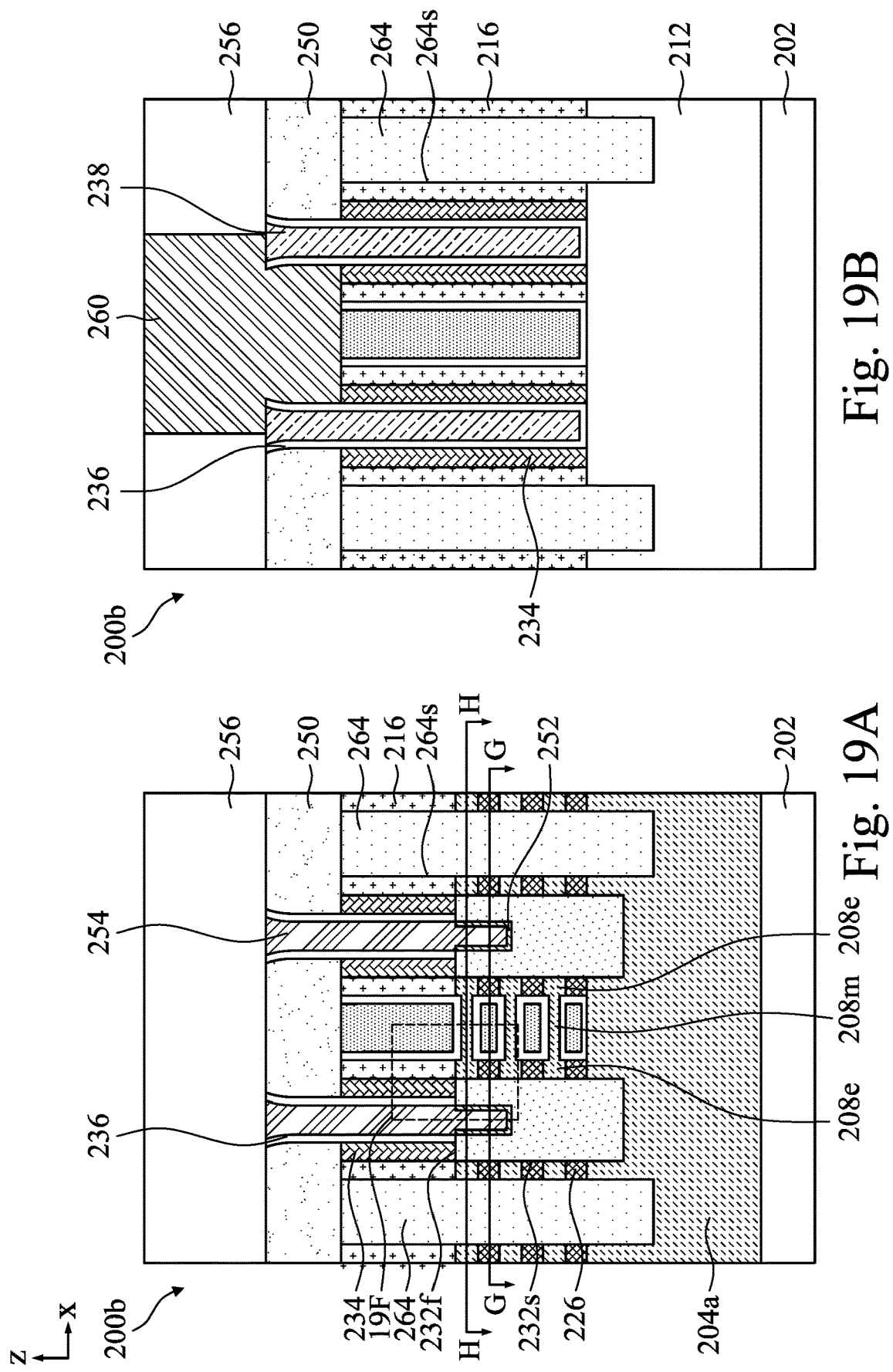
Figures 19C, 19D:
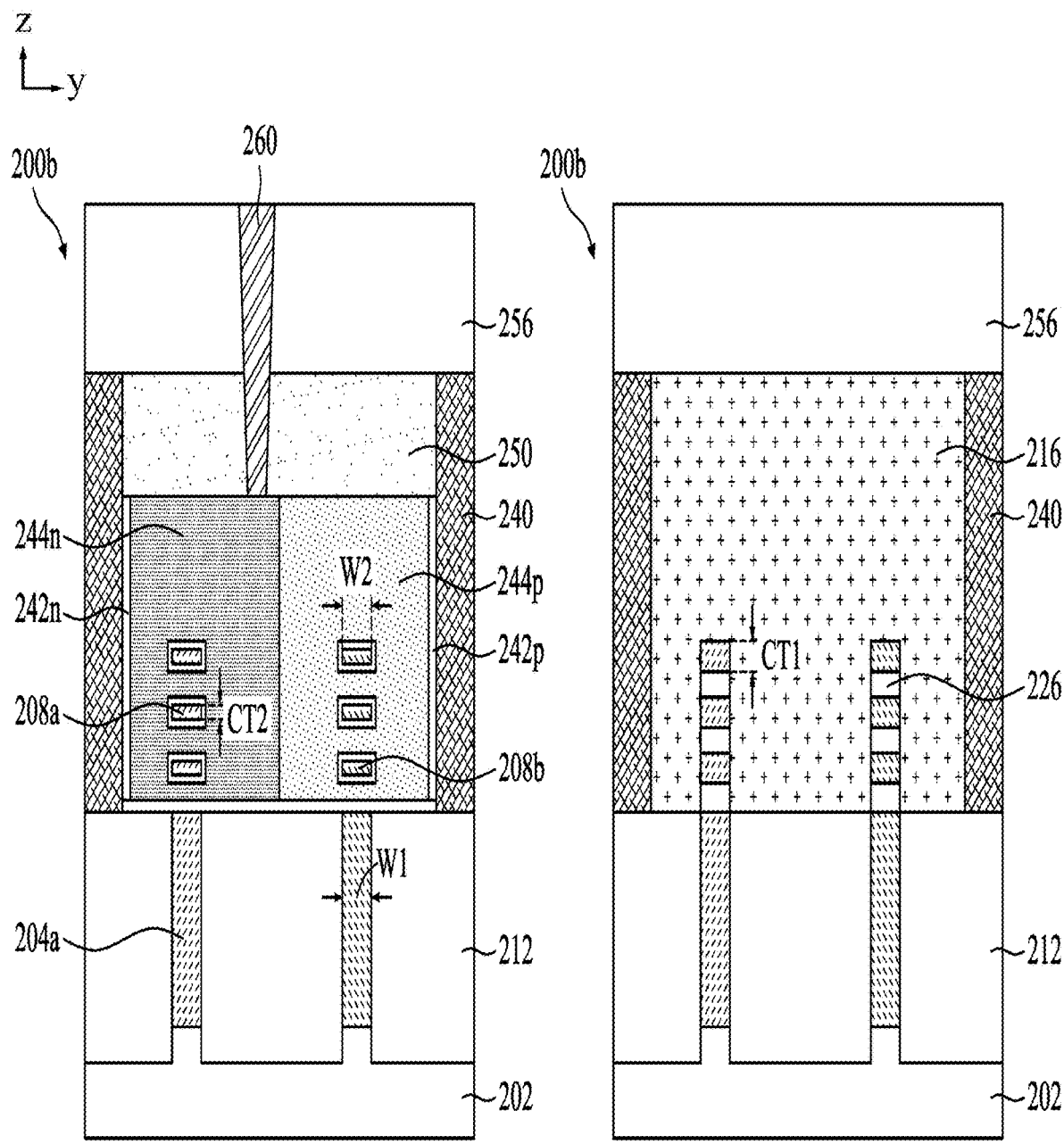
Figures 19E, 19F:
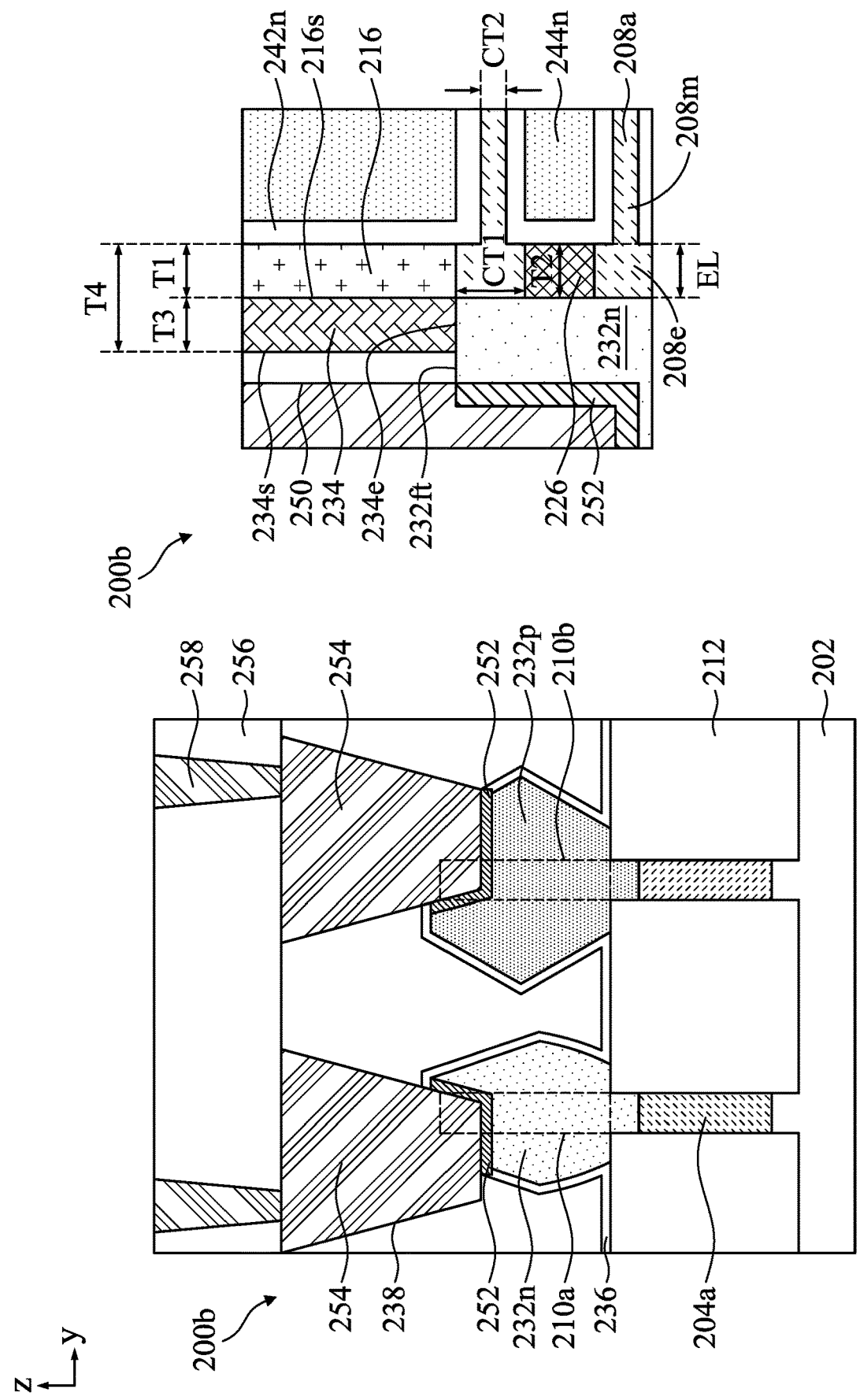

After reduction of the thickness of the semiconductor layers 208a, 208b, operations 120-126 of the method 100a may be subsequently performed to produce the semiconductor device 200b as shown in FIGS. 19A-19H. FIGS. 19A, 19B, 19C, 19D, 19E are schematic sectional views of the semiconductor device 200a along the lines A-A, B-B, C-C, D-D, E-E in FIG. 5 respectively. FIG. 19F is a schematic partial enlarged view of the semiconductor device 200b in region 19F of FIG. 19A. FIGS. 19G-16H are schematic sectional views of the semiconductor device 200a along the lines G-G, H-H in FIG. 19A respectively.

As shown in FIGS. 19A and 19F, the semiconductor layers 208a, 208b between the epitaxial source/drain features 232n or 232p, i.e. the nanosheet channels, are shaped like a dump-bells, each having two thicker end portions 208e connected by a thinner middle portion 208m. The end portions 208e of the semiconductor layer 208a/208b are in contact with the epitaxial source/drain features 232n or 232p. The end portions 208e are also in contact with the inner sidewall spacers 216 and the inner spacers 226. The end portions 202e are surrounded by the inner spacers 226 and the inner sidewall spacers 216. In some embodiments, a length EL along the x-direction is substantially similar to the thickness T1 of the inner sidewall spacers 216 or the thickness T2 of the inner spacers 226. The middle portion 208m of the semiconductor layer 208a/208b is wrapped around by the gate dielectric layer 242n or 242p. The end portions 208e have the original thickness CT1 along the z-direction and the middle portion 208m has the reduced thickness CT2 along the z-direction. In some embodiments, as shown in FIG. 19H, the end portions 208e have the original thickness W1 along the y-direction and the middle portion 208m has the reduced thickness W2 along the y-direction. The reduced thickness in the middle portion reduces device DIBL and improves swing effect. The reduced thickness in the middle portion 208m also provide increased space between nanosheet channels for formation of the gate dielectric layers 242 and the gate electrode layer 244, thus, improving film quality and leading to improved device performance. By thinning the semiconductor nanosheets prior to forming replacement gate structures, embodiments of the present disclosure improve device swing performance, reduce DIBL effect without sacrificing the channel resistance and epitaxial growth margin.

In some embodiments, as shown in FIGS. 19A and 19F, the semiconductor device 200b also have spacers with two levels of thickness, similar to the semiconductor device 200 and 200a. In other embodiments, the outer sidewall spacers 234 may be omitted.

Various embodiments or examples described herein offer multiple advantages over the state-of-art technology. For example, by forming an inner sidewall spacer before the formation of the epitaxial source/drain features and forming an outer sidewall spacer after the epitaxial source/drain features, embodiments of the present disclosure increase the volume of the epitaxial source/drain features, thus improving ion performance. The thicker sidewall spacers also reduce capacitance between source/drain contacts and the gate electrode. By thinning the semiconductor nanosheets prior to forming replacement gate structures, embodiments of the present disclosure improve device swing performance, reduce DIBL effect without sacrificing the channel resistance and epitaxial growth margin.

Some embodiments of the present provide a semiconductor device comprising an epitaxial source/drain feature having a first side, a second side opposing the first side, and a facet surface connecting the first side and the second side; two or more semiconductor layers in contact with the first side of the epitaxial source/drain feature; a gate structure wrapped around the two or more semiconductor layers; an inner spacer disposed between the two or more semiconductor layers, wherein the inner spacer is in contact with the first side of the epitaxial source/drain feature and the gate structure, and the inner spacer has a first thickness; a sidewall spacer in contact with the gate structure, the first side and the facet surface of the epitaxial source/drain feature, wherein a portion of the sidewall spacer has a second thickness, and a ratio of the second thickness over the first thickness is in a range between 1.1 and 2.0.

Some embodiments of the present disclosure provide a semiconductor device two or more semiconductor layers, wherein each of the two or more semiconductor layers includes a first end portion, a second end portion, a middle portion connecting the first and second end portions, the first end portion and second end portion have a first channel thickness, and the middle portion has a second channel thickness less than the first channel thickness; a gate structure wrapped around the middle portions of the two or more semiconductor layers; a first source/drain feature having a first side and a first facet surface connected to the first side, wherein the first side is in contact with the first end portions of the two or more semiconductor layers; a second source/drain feature having a second side and a second facet surface connected to the second side, wherein the second side is in contact with the second end portions of the two or more semiconductor layers; inner spacers disposed between the two or more semiconductor layers; a first sidewall spacer disposed on the gate structure; and a second sidewall spacer disposed on the gate structure.

Some embodiments of the present disclosure provide a method comprising forming a fin structure including two or more first semiconductor layers interposed with two or more second semiconductor layers; forming a sacrificial gate structure over the fin structure; forming an inner sidewall spacer over a sidewall of the sacrificial gate structure, wherein the inner sidewall spacer has a side surface facing away from the sacrificial gate structure; etching back the fin structure along the side surface of the inner sidewall spacer; forming inner spacers by partially removing two or more second semiconductor layers and filling a dielectric material therein; epitaxially growing a source/drain feature from the two or more first semiconductor layers, wherein the source/drain feature has a side and a facet surface, and the side of the source/drain feature is in contact the inner spacers and a portion of the side surface of the inner sidewall spacer;

forming an outer sidewall spacer over the side surface of the inner sidewall spacer, wherein the outer sidewall spacer is in contact with the facet surface of the source/drain feature;

depositing a contact etch stop layer (CESL) over the outer sidewall spacer and the source/drain feature; and depositing an interlayer dielectric (ILD) layer over the CESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, the method comprising:
    forming a fin structure including two or more first semiconductor layers alternately stacked with two or more second semiconductor layers;
    forming a sacrificial gate structure over the fin structure;
    forming an inner sidewall spacer over a sidewall of the sacrificial gate structure, wherein the inner sidewall spacer has a side surface facing away from the sacrificial gate structure;
    etching back the fin structure along the side surface of the inner sidewall spacer;
    forming inner spacers by partially removing two or more second semiconductor layers and filling a dielectric material therein;
    epitaxially growing a source/drain feature from the two or more first semiconductor layers, wherein the source/drain feature has a side when viewed from a first direction and a facet surface when viewed from a second direction substantially perpendicular to the first direction, the side and the facet surface share an edge, and the side of the source/drain feature is in contact the inner spacers and a portion of the side surface of the inner sidewall spacer;
    forming an outer sidewall spacer over the side surface of the inner sidewall spacer, wherein the outer sidewall spacer is in contact with the facet surface of the source/drain feature;
    depositing a contact etch stop layer (CESL) over the outer sidewall spacer and the source/drain feature; and
    depositing an interlayer dielectric (ILD) layer over the CESL.

2. The method of claim 1, further comprising:
    removing the sacrificial gate structure to expose the fin structure;
    removing the two or more second semiconductor layers from the fin structure to expose the two or more first semiconductor layers between the inner spacers because the inner spacers have a thickness less than a combined thickness of the inner sidewall spacer and outer sidewall spacer, and an extended length of the two or more first semiconductor layers is exposed to improve a gate length;
    depositing a gate dielectric layer over the two or more first semiconductor layers; and
    depositing a gate electrode layer over the gate dielectric layer.

3. The method of claim 2, further comprising:
    prior to depositing the gate dielectric layer, reducing a thickness of the two or more first semiconductor layers to improve device swing performance and reduce drain-induced barrier lowering (DIBL) effect, wherein each of the two or more first semiconductor layers include an end portion having a first thickness, and a middle portion having a second thickness, the end portion is in contact with the inner spacers and, and the middle portion is in contact with the gate dielectric layer.

4. The method of claim 2, further comprising:
    etching back the gate electrode layer, the inner sidewall spacer and the outer sidewall spacer; and
    depositing a self-aligned dielectric layer over the gate electrode layer, the inner sidewall spacer, and the outer sidewall spacer.

5. The method of claim 4, further comprising:
    forming a source/drain contact feature in the ILD layer, wherein the inner sidewall spacer and the outer sidewall spacer are disposed between the source/drain contact feature and the gate electrode layer with reduced capacitance therebetween.

6. The method of claim 1, wherein the forming of the outer sidewall spacer is performed after the epitaxially growing of the source/drain feature.

7. A method, comprising:
    forming a semiconductor device, comprising:
        an epitaxial source/drain feature having a first side, a second side opposing the first side, and a facet surface connecting the first side and the second side;
        two or more semiconductor layers in contact with the first side of the epitaxial source/drain feature;
        a gate structure wrapped around the two or more semiconductor layers;
        an inner spacer disposed between the two or more semiconductor layers, wherein the inner spacer is in contact with the first side of the epitaxial source/drain feature and the gate structure, and the inner spacer has a first thickness; and
        a sidewall spacer in contact with the gate structure, the first side and the facet surface of the epitaxial source/drain feature, wherein a portion of the sidewall spacer has a second thickness, and a ratio of the second thickness over the first thickness is in a range between 1.1 and 2.0.

8. The method of claim 7, wherein the sidewall spacer comprises a first layer extending along the gate structure and a second layer disposed adjacent to the first layer.

9. The method of claim 8, wherein the second layer of the sidewall spacer is in contact with the facet surface of the epitaxial source/drain feature.

10. The method of claim 8, wherein the first layer of the sidewall spacer has the first thickness.

11. The method of claim 8, further comprising:
    forming a source/drain contact feature connected to the epitaxial source/drain feature, wherein the first layer of the sidewall spacer and the second layer of the sidewall spacer are disposed between the source/drain contact feature and the gate structure.

12. The method of claim 7, further comprising:
wherein one of the two or more semiconductor layers comprises two end portions and a middle portion connecting the two end portions, and a thickness of the middle portion is less than a thickness of the two end portions.

13. The method of claim 12, wherein a length of each of the two end portions is substantially equal to the first thickness.

14. A method, comprising:
forming a fin structure including two or more first semiconductor layers alternately stacked with two or more second semiconductor layers;
forming a sacrificial gate structure over the fin structure;
forming a first sidewall spacer on sidewalls of the sacrificial gate structure;
etching back the fin structure along the first sidewall spacer;
epitaxially growing a source/drain feature from the two or more first semiconductor layers;
forming a second sidewall spacer on the first sidewall spacer and a surface of the source/drain feature;
depositing a contact etch stop layer (CESL) over the second sidewall spacer and the source/drain feature; and
depositing an interlayer dielectric (ILD) layer over the CESL.

15. The method of claim 14, further comprising:
forming inner spacers by partially removing two or more second semiconductor layers and filling a dielectric material therein prior to epitaxially growing the source/drain feature.

16. The method of claim 15, wherein the inner spacers have a first thickness, and the first and second sidewall spacers have a second thickness greater than the first thickness.

17. The method of claim 16, wherein, when viewed from top, the first sidewall spacer has a first length, and the second sidewall spacer has a second length less than the first length.

18. The method of claim 17, wherein the first inner sidewall spacer has the first thickness.

19. The method of claim 15, further comprising:
removing the sacrificial gate structure;
removing the two or more second semiconductor layers between the inner spacers; and
forming a replacement gate structure around the two or more first semiconductor layers.

20. The method of claim 19, further comprising:
reducing a thickness of two or more first semiconductor layers prior to forming the replacement gate structure.

* * * * *